(12) United States Patent
Lim et al.

(10) Patent No.: US 11,900,709 B2
(45) Date of Patent: Feb. 13, 2024

(54) FINGERPRINT SENSOR PACKAGE AND SMART CARD INCLUDING THE SAME

(71) Applicant: Samsung Electronics Co., Ltd., Suwon-si (KR)

(72) Inventors: Jaehyun Lim, Hwaseong-si (KR); Younghwan Park, Hwaseong-si (KR); Kwangjin Lee, Bucheon-si (KR); Dongha Lee, Asan-si (KR); Hyuntaek Choi, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 287 days.

(21) Appl. No.: 17/514,088

(22) Filed: Oct. 29, 2021

(65) Prior Publication Data

US 2022/0293507 A1   Sep. 15, 2022

(30) Foreign Application Priority Data

Mar. 9, 2021   (KR) .......................... 10-2021-0030940

(51) Int. Cl.
*H01L 23/498*   (2006.01)
*H01L 23/31*   (2006.01)
(Continued)

(52) U.S. Cl.
CPC ......... *G06V 40/12* (2022.01); *G06K 19/0718* (2013.01); *G06K 19/07354* (2013.01);
(Continued)

(58) Field of Classification Search
CPC ............... G06V 40/12; G06K 19/0718; G06K 19/07354; G06K 19/07747;
(Continued)

(56) References Cited

U.S. PATENT DOCUMENTS 10,061,962 B2   8/2018 Chang et al.
10,475,842 B2   11/2019 Kim et al.
(Continued)

FOREIGN PATENT DOCUMENTS

KR   10-1783711 B1   10/2017
KR   10-2017-0126330 A   11/2017
(Continued)

*Primary Examiner* — Jermele M Hollington
*Assistant Examiner* — Suresh K Rajaputra
(74) *Attorney, Agent, or Firm* — Harness, Dickey & Pierce, P.L.C.

(57) ABSTRACT

A fingerprint sensor package includes a first substrate including a core insulating layer; a first bonding pad on the core insulating layer; and an external connection pad between an edge of the second surface of the core insulating layer and the first bonding pad, a second substrate on the core insulating layer, the second substrate including: a plurality of first sensing patterns spaced apart in a first direction and extending in a second direction intersecting with the first direction; a plurality of second sensing patterns spaced apart from each other in the second direction and extending in the first direction; and a second bonding pad, a conductive wire connecting the first bonding pad to the second bonding pad; a controller chip on the second substrate; and a molding layer covering the second substrate and the first bonding pad and spaced apart from the external connection pad.

20 Claims, 20 Drawing Sheets

(51) Int. Cl.
  *H01L 23/00*    (2006.01)
  *G06K 9/00*     (2022.01)
  *G06V 40/12*    (2022.01)
  *G06K 19/07*    (2006.01)
  *G06K 19/073*   (2006.01)
  *G06K 19/077*   (2006.01)

(52) U.S. Cl.
  CPC .... *G06K 19/07747* (2013.01); *H01L 23/3121* (2013.01); *H01L 2224/16227* (2013.01)

(58) Field of Classification Search
  CPC ....... H01L 23/3121; H01L 2224/16227; H01L 2224/0401; H01L 2924/19107; H01L 24/16; H01L 2924/19105
  See application file for complete search history.

(56) References Cited

U.S. PATENT DOCUMENTS

| | | | | |
|---|---|---|---|---|
| 2017/0336910 | A1* | 11/2017 | Han | G06F 3/041661 |
| 2020/0311509 | A1* | 10/2020 | Benkley, III | G06F 21/32 |
| 2022/0129657 | A1* | 4/2022 | Lim | G06V 40/1329 |

FOREIGN PATENT DOCUMENTS

| | | |
|---|---|---|
| KR | 10-2018-0016284 A | 2/2018 |
| KR | 10-2018-0038971 A | 4/2018 |

* cited by examiner

FINGERPRINT SENSOR PACKAGE AND SMART CARD INCLUDING THE SAME

CROSS-REFERENCE TO RELATED APPLICATION

This application is based on and claims priority under 35 U.S.C. § 119 to Korean Patent Application No. 10-2021-0030940, filed on Mar. 9, 2021, in the Korean Intellectual Property Office, the disclosure of which is incorporated by reference herein in its entirety.

BACKGROUND

The present inventive concepts relate to a fingerprint sensor package and a smart card including the same.

Fingerprint recognition technology is used to prevent various security incidents by recognizing a user's fingerprint to undergo registration and authentication procedures. In particular, this is applied to network defense of individuals and organizations, protection of various contents and data, and secure access to financial information. The fingerprint sensor acquires a user's fingerprint information using an optical method, a capacitive method, an ultrasonic method, a thermal sensing method, or the like. The recent trend in the fingerprint sensor industry is to achieve low cost while continuously reducing the size and thickness of the product. Accordingly, the fingerprint sensor package is required to satisfy economic feasibility at the same time while maintaining the reliability and sensitivity of the acquisition of fingerprint information and reducing the total size and height.

SUMMARY

The present inventive concepts provide a fingerprint sensor package with improved reliability and a smart card including the same so as to prevent a financial accident due to theft or loss of the smart card.

The problems to be solved by the technical spirit of the present inventive concepts are not limited to the problems mentioned above, and other problems not mentioned will be clearly understood by those skilled in the art from the following description.

In some example embodiments, a fingerprint sensor package includes a first substrate, a second substrate, a conductive wire, a controller chip, and a molding layer. The first substrate may include a core insulating layer including a first surface and a second surface opposite to each other, a first bonding pad on the second surface of the core insulating layer, and an external connection pad between an edge of the second surface of the core insulating layer and the first bonding pad. The second substrate may be on the second surface of the core insulating layer and may include a plurality of first sensing patterns isolated from direct contact with each other in a first direction, and extending in a second direction intersecting with the first direction, a plurality of second sensing patterns isolated from direct contact with each other in the second direction and extending in the first direction, and a second bonding pad. The conductive wire may connect the first bonding pad to the second bonding pad. The controller chip may be on the second substrate. The molding layer may be on the second surface of the core insulating layer and the second substrate. The molding layer may cover the second substrate and the first bonding pad. The molding layer may be isolated from direct contact with the external connection pad.

In some example embodiments, a fingerprint sensor package may include a first substrate, a second substrate, a conductive wire, a controller chip, connection bumps, and a molding layer. The first substrate may include a core insulating layer including a first surface and a second surface opposite to each other, a coating layer on the first surface of the core insulating layer, a ground bezel on the first surface of the core insulating layer and surrounding the coating layer in a first direction and a second direction intersecting with the first direction, an adhesive layer between the coating layer and the core insulating layer and between the core insulating layer and the ground bezel, a first bonding pad on the second surface of the core insulating layer, and an external connection pad between an edge of the second surface of the core insulating layer and the first bonding pad. The second substrate may include a plurality of first sensing patterns isolated from direct contact with each other in the first direction and extending in the second direction, a plurality of second sensing patterns isolated from direct contact with each other in the second direction and extending in the first direction, and a second bonding pad. The conductive wire may electrically connect the first bonding pad to the second bonding pad. The controller chip may be on the second substrate. The connection bumps may be between the second substrate and the controller chip and may electrically connect the second substrate to the controller chip. The molding layer may cover the second substrate and the controller chip and may extend from a side surface of the second substrate to a boundary between the second bonding pad and the external connection pad. The plurality of first sensing patterns and the plurality of second sensing patterns may be isolated from direct contact with each other in a third direction perpendicular to the first and second directions, and the plurality of first sensing patterns and the plurality of second sensing patterns may collectively comprise a plurality of capacitors.

In some example embodiments, a smart card may include a card main body, a security chip, and a fingerprint sensor package. The card main body may include a groove region and a connection pad. The security chip may be in the card main body. The fingerprint sensor package may be configured to sense a user's fingerprint and transmit a signal for a sensing result to the security chip. The fingerprint sensor package may include a first substrate, a second substrate, a conductive wire, a controller chip, and a molding layer. The substrate may include a core insulating layer including a first surface and a second surface opposite to each other, a first bonding pad on the second surface of the core insulating layer, and an external connection pad between an edge of the second surface of the core insulating layer and the first bonding pad. The second substrate may be on the second surface of the core insulating layer and may include a plurality of first sensing patterns isolated from direct contact with each other in a first direction and extending in a second direction intersecting with the first direction, a plurality of second sensing patterns isolated from direct contact with each other in the second direction and extending in the first direction, and a second bonding pad. The conductive wire may extend between the first bonding pad and the second bonding pad and may electrically connect the first bonding pad to the second bonding pad. The controller chip may be on the second substrate. The molding layer may be on the second surface of the core insulating layer and on the second substrate. The molding layer may cover the second substrate and the first bonding pad, but may not cover the external connection pad. The external connection pad of the first substrate may be bonded to the connection pad of the card main body.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
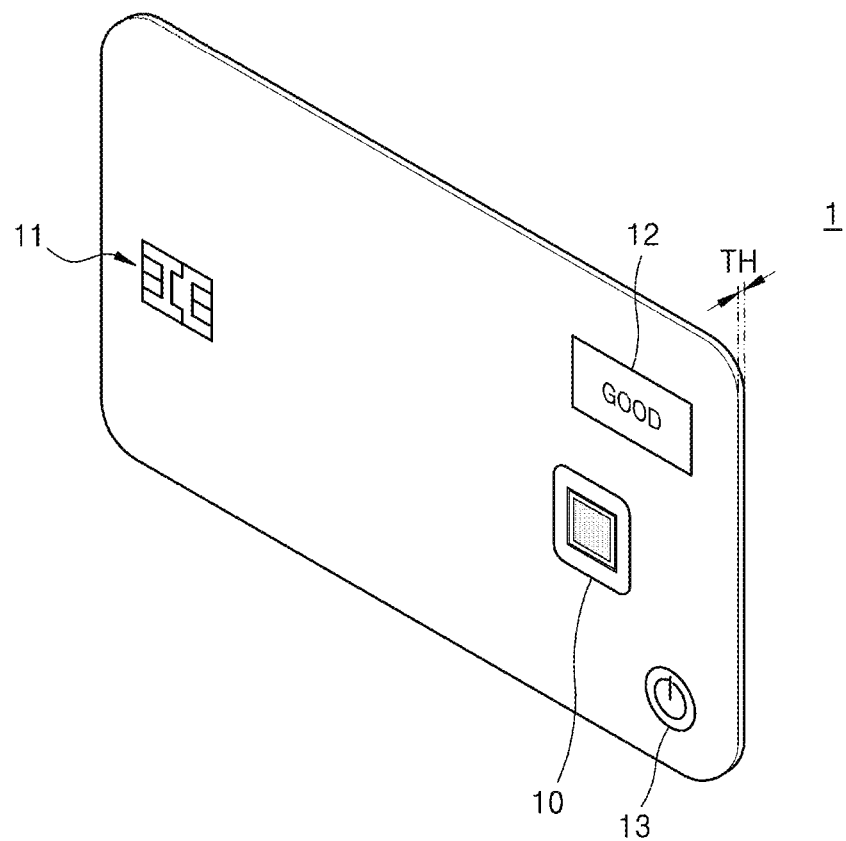
FIG. 1 is a schematic perspective view showing a smart card according to some example embodiments of the present inventive concepts.

Hereinafter, some example embodiments of the technical idea of the present inventive concepts will be described in detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a schematic perspective view showing a smart card 1 according to some example embodiments of the present inventive concepts.

Referring to FIG. 1, the smart card 1 may include a fingerprint sensor package 10, a security chip 11, a display unit 12 (e.g., display screen device, light emitting diode (LED) display screen, an organic LED (OLED) display screen, etc.), and a power button 13.

The smart card 1 may further include a memory device for storing information displayed on a conventional credit card or check card, such as a card number identification unit, an expiration date identification unit, and a user name. The smart card 1 may further include an RF chip.

The fingerprint sensor package 10 may recognize the touched fingerprint when the user brings his or her fingerprint into contact with a fingerprint sensor. The fingerprint sensor package 10 may compare the recognized fingerprint with the registered fingerprint to determine whether the recognized fingerprint matches the registered fingerprint. The fingerprint sensor package 10 may operate after the smart card 1 is switched to an on state.

The security chip 11 may store encrypted financial information. When the recognized fingerprint matches the registered fingerprint, the security chip 11 may grant payment authorization to the user of the smart card 1. For example, based on the recognition result of the fingerprint sensor package 10, the security chip 11 grants a payment right to the user, so that the smart card 1 may prevent financial accidents caused by theft or loss.

The display unit 12 may display whether the recognized fingerprint matches the registered fingerprint, whether there is on/off state, and the like. The display unit 12 may display letters, numbers, special symbols, and the like, and may further include a light emitting unit in some cases. However, the display unit 12 may be omitted depending on the type of the smart card 1.

The power button 13 may turn the smart card 1 on/off. The smart card 1 in the off state may be switched to the on state by the operation of the power button 13, and the smart card 1 in the on state may be switched to the off state by manipulating the power button 13. Also, when a set time elapses after the smart card 1 is switched to the on state, the smart card 1 may be automatically switched to the off state. However, the power button 13 may be omitted depending on the type of the smart card 1.

In some example embodiments, the thickness TH of the smart card 1 may range from about 0.5 mm to about 1 mm. In addition, the thickness TH of the smart card 1 may be about 0.84 mm or less according to the international standard. For example, the thickness TH of the smart card 1 may be about 0.76 mm or less.

Because the smart card 1 of some example embodiments includes the fingerprint sensor package 10 and has the same thickness as a conventional credit card or check card, the smart card 1 may provide a high level of user experience. In addition, the cross-sectional view of the smart card 1 of some example embodiments may be substantially the same as or similar to that schematically shown in FIG. 10F.

FIGS. 2A to 2E are diagrams illustrating a fingerprint sensor package 10 according to some example embodiments of the present inventive concepts.

Figure 2A:
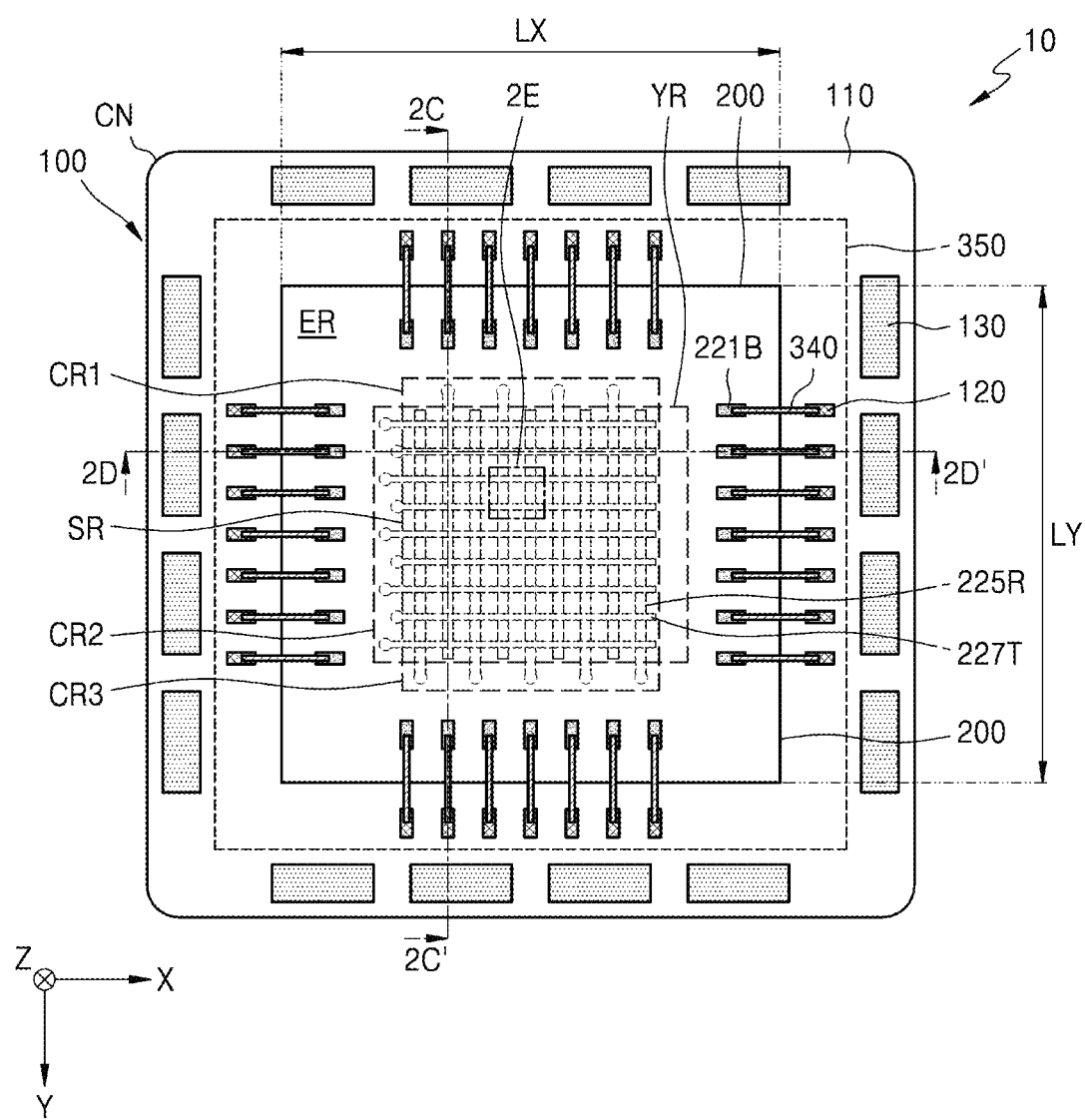
FIG. 2A is a bottom view schematically showing a layout of some components of a fingerprint sensor package according to some example embodiments of the present inventive concepts.
Figure 2B:
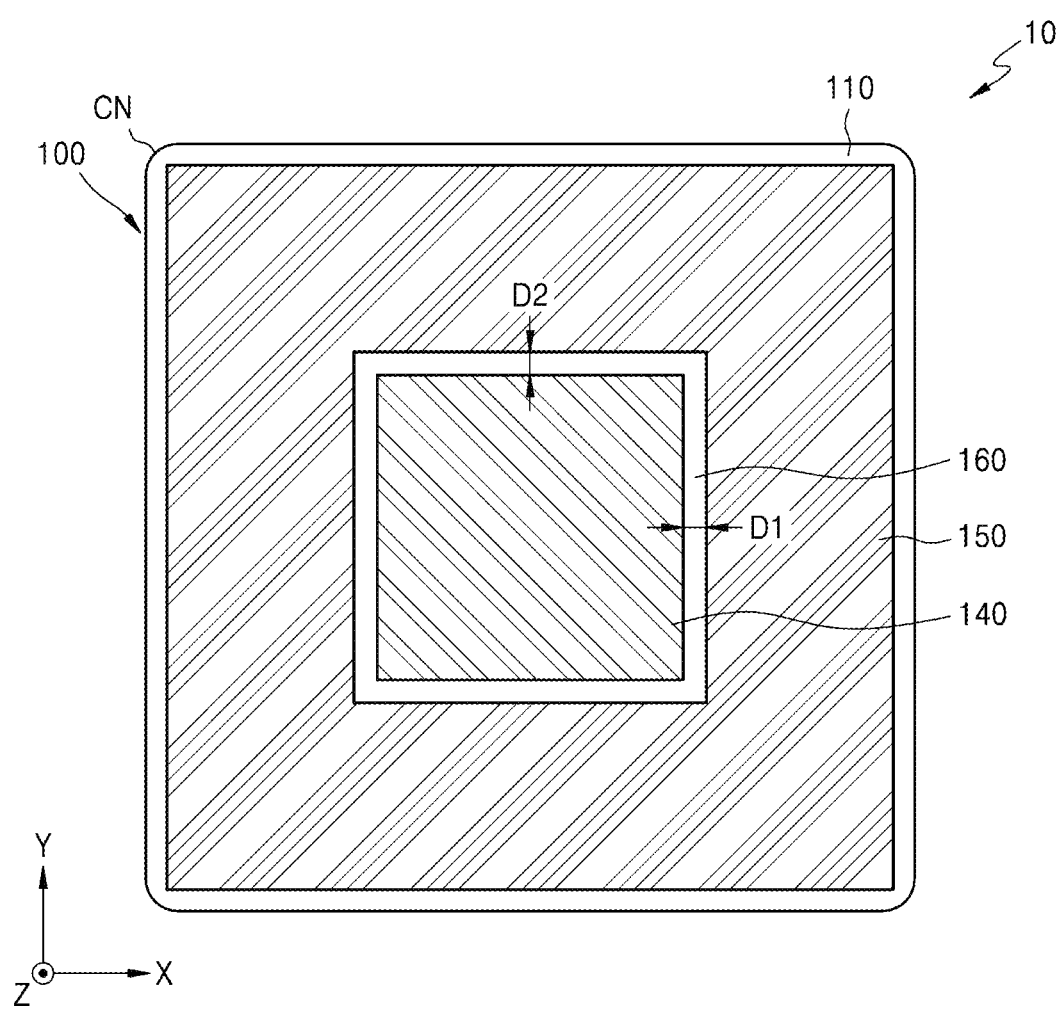
FIG. 2B is a plan view illustrating the fingerprint sensor package of FIG. 2A.
Figure 2C:
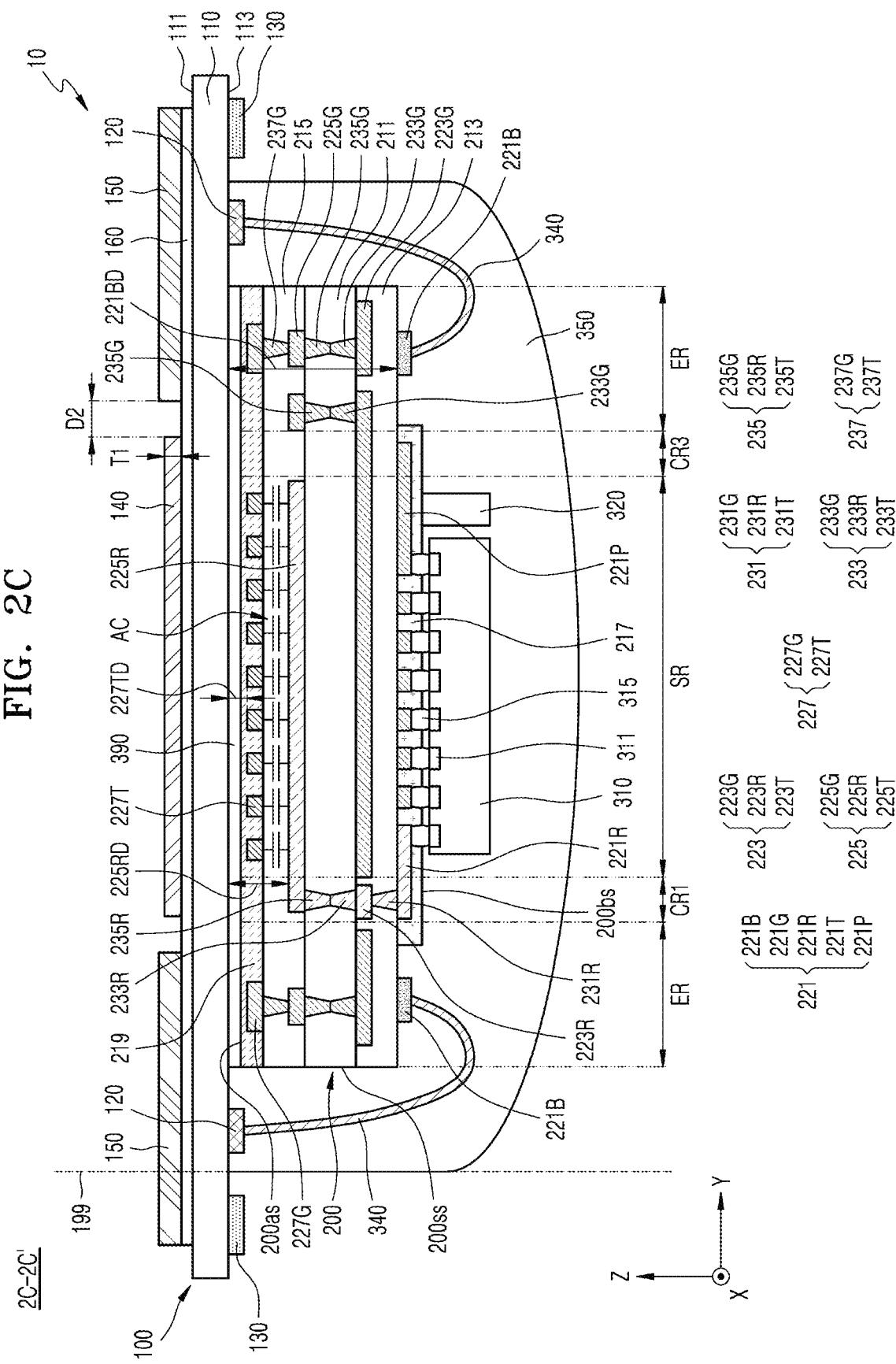
FIG. 2C is a cross-sectional view taken along the line 2C-2C' of FIG. 2A.
Figure 2D:
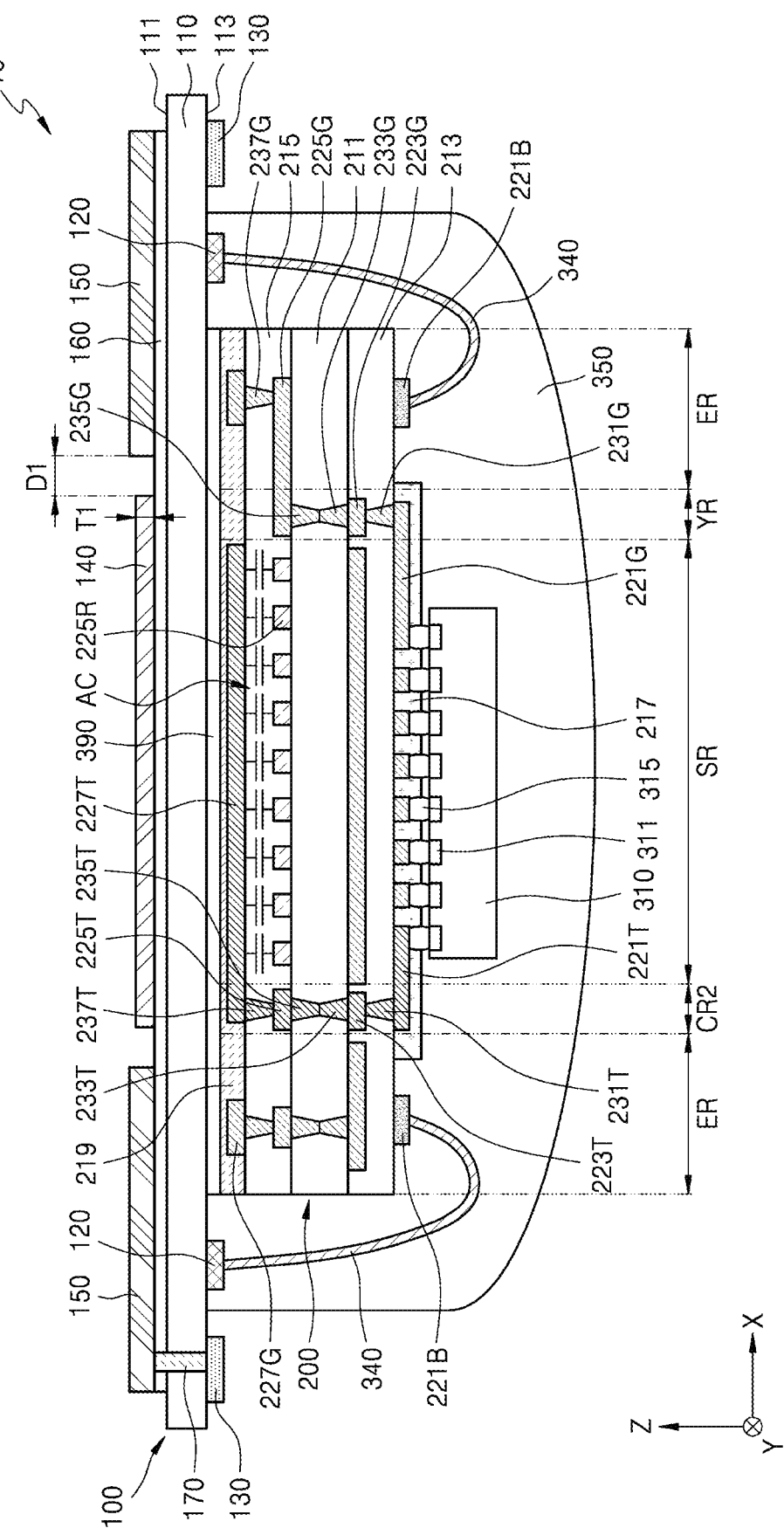
FIG. 2D is a cross-sectional view taken along the line 2D-2D' of FIG. 2A.
Figure 2E:
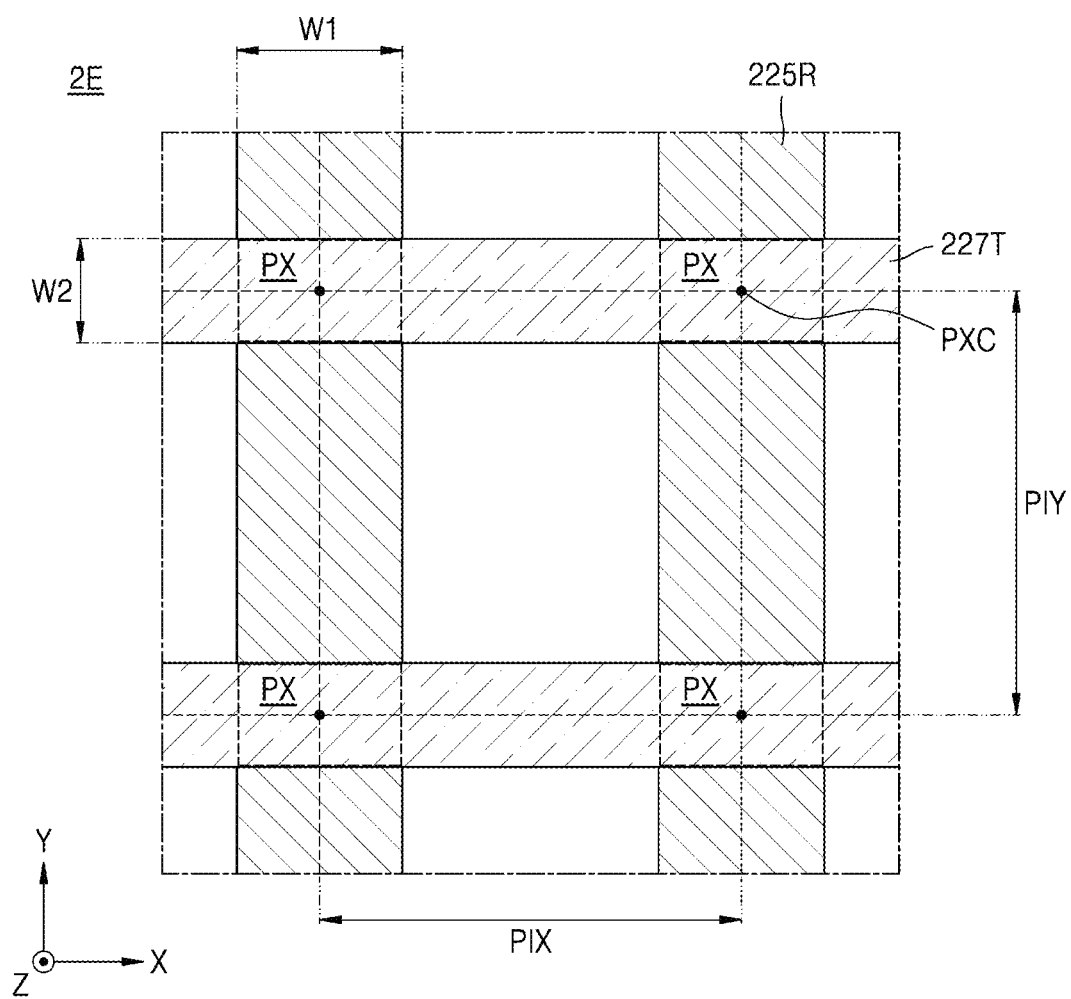
FIG. 2E is an enlarged view showing an enlarged region indicated by "2E" in FIG. 2A.

Specifically, FIG. 2A is a bottom view schematically showing the layout of some components of the fingerprint sensor package 10, FIG. 2B is a plan view showing the fingerprint sensor package 10 of FIG. 2A, FIG. 2C is a cross-sectional view taken along the line 2C-2C' of FIG. 2A, FIG. 2D is a cross-sectional view taken along the line 2D-2D' of FIG. 2A, and FIG. 2E is an enlarged view showing an enlarged area indicated by "2E" in FIG. 2A.

Referring to FIGS. 2A to 2E, the fingerprint sensor package 10 may include a first substrate 100, a second substrate 200, a controller chip 310, a passive element 320, and a molding layer 350.

The total thickness of the fingerprint sensor package 10 of some example embodiments may be about 0.76 mm or less. In some example embodiments, the total thickness of the fingerprint sensor package 10 may be about 0.5 mm or less. For example, the total thickness of the fingerprint sensor package 10 may range from about 0.1 mm to about 0.4 mm. Accordingly, the fingerprint sensor package 10 may be easily applied to various products (e.g., the smart card described above) that are bent or require a thin thickness.

The first substrate 100 may include a core insulating layer 110, first bonding pads 120, external connection pads 130, a coating layer 140, a ground bezel 150, and an adhesive layer 160.

The first substrate 100 may include a printed circuit board (PCB). In some example embodiments, the first substrate 100 may include a flexible PCB (FPCB) that is flexible and thus bendable. In some example embodiments, the first substrate 100 may include a rigid-type PCB.

The core insulating layer 110 has a substantially film or plate shape, and may include a first surface 111 and a second surface 113 opposite to each other. Here, a direction parallel to a pair of edges of the core insulating layer 110 is defined as a first direction (X direction), a direction parallel to the other pair of edges is defined as a second direction (Y direction), and a direction perpendicular to the main surface (the first surface 111 or the second surface 113) of the core insulating layer 110, and thus perpendicular to both the first direction and the second direction, is defined as a third direction (Z direction).

The core insulating layer 110 may include an insulating material. For example, the core insulating layer 110 may be a flexible film including polyimide. For example, the core insulating layer 110 may be formed of an epoxy-based resin or a synthetic resin such as acrylic, polyether nitrile, polyether sulfone, polyethylene terephthalate, or polyethylene naphthalate.

The second surface 113 of the core insulating layer 110 may include a mounting region on which the first substrate 100 is mounted. The first bonding pads 120 may be provided on (e.g., directly or indirectly on) the second surface 113 of the core insulating layer 110. The first bonding pads 120 may be laterally spaced apart from (e.g., isolated from direct contact with) the mounting region. For example, the first bonding pads 120 may be arranged along at least one of edges of the mounting region of the core insulating layer 110. The first bonding pads 120 may be connected to conductive wires 340, and may be electrically connected to second bonding pads 221B of the second substrate 200 through the conductive wires 340.

The external connection pads 130 may be disposed on (e.g., directly or indirectly on) the second surface 113 of the core insulating layer 110. The external connection pads 130 may be disposed adjacent to the edge of the second surface 113 of the core insulating layer 110, and may be arranged along the edge of the second surface 113 of the core insulating layer 110. The external connection pad 130 may be closer to the edge of the second surface 113 of the core insulating layer 110 than the first bonding pad 120. That is, the distance between the edge of the second surface 113 of the core insulating layer 110 and the external connection pad 130 may be less than the distance between the edge of the second surface 113 of the core insulating layer 110 and the first bonding pad 120. Restated, and as shown in at least FIG. 2C, an external connection pad 130 may be between an edge of the second surface 113 of the core insulating layer 110 and a first bonding pad 120. The external connection pad 130 may be a pad electrically and physically connected to an external device (e.g., a card main body 500 of FIG. 10E). The external connection pad 130 may be electrically connected to the first bonding pads 120 through a conductive pattern provided in the first substrate 100.

For example, the first bonding pads 120 and the external connection pads 130 may include at least one selected from copper (Cu), aluminum (Al), nickel (Ni), silver (Ag), gold (Au), platinum (Pt), tin (Sn), lead (Pb), titanium (Ti), chromium (Cr), Palladium (Pd), indium (In), zinc (Zn), carbon (C), and alloys thereof.

The coating layer 140 may be disposed on (e.g., directly or indirectly on) the first surface 111 of the core insulating layer 110. The coating layer 140 is a portion of the first substrate 100 that is configured to be in contact (e.g., direct contact) with the user's fingerprint and may be disposed above the sensing region SR of the second substrate 200. In a plan view, the coating layer 140 may entirely cover the sensing region SR of the second substrate 200 in the third direction, or Z direction (e.g., entirely overlap the sensing region SR in the Z direction). The coating layer 140 may protect the sensing region SR from external influences such as contamination, impact, and scratches. Accordingly, the coating layer 140 may include high-strength glass and/or plastic, but is not limited thereto. In some example embodiments, the coating layer 140 may include a material having a dielectric constant suitable for fingerprint recognition (e.g., a high-k material).

The thickness T1 of the coating layer 140 (e.g., thickness in the Z direction, or third direction, as shown in at least FIG. 2C) may be formed to be about 100 μm or less considering the sensing sensitivity. In some example embodiments, the thickness T1 of the coating layer 140 may be in a range of about 5 μm to about 100 μm (e.g., between about 5 μm and about 100 μm).

The ground bezel 150 may be disposed on (e.g., directly or indirectly) the first surface 111 of the core insulating layer 110 and disposed around the coating layer 140 (e.g., surrounding the coating layer 140 in the X and Y directions, or first and second directions). When the coating layer 140 is positioned approximately at the center of the first surface 111 of the core insulating layer 110, the ground bezel 150 is disposed at the outer portion of the first surface 111 of the core insulating layer 110. The ground bezel 150 may be disposed around the coating layer 140 to reduce sensing noise while a user's fingerprint is in contact with the coating layer 140. For example, the ground bezel 150 may include a conductive material, for example, a metal such as copper (Cu) or aluminum (Al).

The ground bezel 150 may be electrically grounded. In some example embodiments, the ground bezel 150 may be configured to receive a reference potential through the conductive via 170 penetrating the core insulating layer 110 and the adhesive layer 160. The conductive via 170 is configured to electrically connect the ground bezel 150 to the external connection pad 130, and may be used as an electrical path for transmitting a reference potential to the ground bezel 150.

The ground bezel 150 may extend along the circumference of the coating layer 140 covering the sensing region SR and thus may completely surround the coating layer 140 in the first and second directions, or X and Y directions. The ground bezel 150 may have a ring shape surrounding the coating layer 140 in a plan view. The distance between the ground bezel 150 and the coating layer 140 may be constant.

The ground bezel 150 may be spaced apart from (isolated from direct contact with) the core insulating layer 110 by a first distance D1 in the first direction (X direction), and may be spaced apart from (isolated from direct contact with) the core insulating layer 110 by a second distance D2 in the second direction (Y direction). In some example embodiments, the first distance D1 may be substantially the same as the second distance D2. In some example embodiments, each of the first distance D1 and the second distance D2 may be in a range of about 50 μm or more. In some example embodiments, each of the first distance D1 and the second distance D2 may be about 5 mm or less. In some example embodiments, each of the first distance D1 and the second distance D2, and thus the distance between the ground bezel 150 and the coating layer 140, may be between about 50 μm and about 5 mm.

The adhesive layer 160 may be disposed between (e.g., between in the third direction) the first surface 111 of the core insulating layer 110 and the coating layer 140, and between (e.g., between in the third direction) the first surface 111 of the core insulating layer 110 and the ground bezel 150. The adhesive layer 160 may attach the coating layer 140 to the core insulating layer 110 and the ground bezel 150 to the core insulating layer 110. For example, the adhesive layer 160 may be formed of an insulating adhesive.

In some example embodiments, and as shown in at least FIG. 2A, each corner CN of the first substrate 100 may have a round shape in the first and second directions (e.g., X and Y directions). As further shown in at least FIG. 2A, the first substrate 100 may have a rectangular planar shape (e.g., extending in a plane extending in the first and second directions (e.g., X and Y directions)) with round corners CN that are rounded (e.g., curved in a 90-degree arc in a plane extending in the first and second directions (e.g., X and Y directions)). In some example embodiments, the radius of curvature of each corner CN of the first substrate 100 may be in a range of about 0.1 mm to about 2 mm (e.g., between about 0.1 mm and about 2 mm). For example, the radius of curvature of the corner CN of the first substrate 100 may be about 1 mm. The reason that the corner CN of the first substrate 100 has a round shape is to effectively prevent cracks that may occur in the corner CN during the process of cutting the first panel substrate 100P (refer to FIG. 10D) using a punching facility PM (refer to FIG. 10d).

The second substrate 200 may be disposed on the first substrate 100. As shown in at least FIG. 2C, the second substrate 200 may be on (e.g., directly or indirectly on) the second surface 113 of the core insulating layer 110 of the first substrate 100. The second substrate 200 may be mounted on the mounting region of the second surface 113 of the core insulating layer 110. As shown in at least FIGS. 2C and 2D, a substrate adhesive layer 390 for attaching the second substrate 200 to the core insulating layer 110 may be between the upper surface 200as of the second substrate 200 and the second surface 113 of the core insulating layer 110. The second substrate 200 may be electrically connected to the first substrate 100 through conductive wires 340.

The second substrate 200 may include a PCB. In some example embodiments, the second substrate 200 may include a rigid-type substrate. The second substrate 200 may have a substantially rectangular planar shape or a square planar shape. The second substrate 200 may include an upper surface 200as and a lower surface 200bs opposite to each other, and the upper surface 200as of the second substrate 200 may be a surface in contact with the first substrate 100, and the lower surface 200bs of the second substrate 200 may be a surface on which components such as the controller chip 310 are mounted (e.g., directly or indirectly on the second substrate 200).

The first length LX of the second substrate 200 in the first direction (X direction) may be in a range of about 10 mm to about 15 mm. In addition, the second length LY in the second direction (Y direction) of the second substrate 200 may be in a range of about 10 mm to about 15 mm. For example, the first length LX of the second substrate 200 may be about 12.7 mm, and the second length LY may be about 12.7 mm. However, the first length LX and the second length LY of the second substrate 200 are not limited to the above numerical values.

As shown in at least FIGS. 2C-2D, the second substrate 200 may include a base layer 211, a lower insulating layer 213 on (e.g., directly or indirectly on) the lower surface of the base layer 211, an upper insulating layer 215 on (e.g., directly or indirectly on) the upper surface of the base layer 211, a lower protective layer 217 on (e.g., directly or indirectly on) a lower surface of the lower insulating layer 213, and an upper protective layer 219 on (e.g., directly or indirectly on) an upper surface of the upper insulating layer 215.

In addition, the second substrate 200 may be a multi-layered PCB including a plurality of conductive layers. The second substrate 200 may include conductive layers positioned at different vertical levels, and conductive vias for electrically connecting the conductive layers. The conductive layers and the conductive vias may include at least one selected from copper (Cu), aluminum (Al), nickel (Ni), silver (Ag), gold (Au), platinum (Pt), tin (Sn), lead (Pb), titanium (Ti), chromium (Cr), It may include at least one selected from palladium (Pd), indium (In), zinc (Zn), carbon (C), and alloys thereof.

For example, the second substrate 200 may include first conductive layer 221, second conductive layer 223, third conductive layer 225, and fourth conductive layer 227 in the order of the distance spaced apart from the first substrate 100. The first conductive layer 221 may be on the lower surface of the lower insulating layer 213, the second conductive layer 223 may be on the lower surface of the base layer 211, the third conductive layer 225 may be on the upper surface of the base layer 211, and the fourth conductive layer 227 may be on the upper surface of the upper insulating layer 215.

The first conductive layer 221 may include second bonding pads 221B, first-first sensing pads 221R, first-second sensing pads 221T, a first ground pattern 221G, and a power supply pattern 221P. The second conductive layer 223 may include second-first sensing pads 223R, second-second sensing pads 223T, and a second ground pattern 223G. The third conductive layer 225 may include first sensing patterns 225R, third-second sensing pads 225T, and a third ground pattern 225G. The fourth conductive layer 227 may include second sensing patterns 227T and a fourth ground pattern 227G. As shown, the first sensing patterns 225R may be on (e.g., directly or indirectly on) the upper surface of the base layer 211. As shown, the second sensing patterns 227T may be on (e.g., directly or indirectly on) the upper surface of the upper insulating layer 215.

In addition, the second substrate 200 may include first conductive vias 231 for electrically connecting the first conductive layer 221 to the second conductive layer 223, second conductive vias 233 and third conductive vias 235 for electrically connecting the second conductive layer 223 to the third conductive layer 225, and fourth conductive vias 237 for electrically connecting the third conductive layer 225 to the fourth conductive layer 227. The first conductive vias 231 may at least partially penetrate the lower insulating layer 213, and the second conductive vias 233 may partially penetrate the base layer 211, and the third conductive vias 235 may partially penetrate the base layer 211, and the fourth conductive vias 237 may at least partially penetrate the upper insulating layer 215.

The first conductive vias 231 may include first-first sensing vias 231R for electrically connecting the first-first sensing pads 221R to the second-first sensing pads 223R, first-second sensing vias 231T for electrically connecting the first-second sensing pads 221T to the second-second sensing pads 223T, and a first ground via 231G for electrically connecting the first ground pattern 221G to the second ground pattern 223G. In some example embodiments, the first conductive vias 231 may have a tapered structure in which a horizontal width decreases toward the base layer 211.

The second conductive vias 233 may include second-first sensing vias 233R for electrically connecting the second-first sensing pads 223R to the first sensing patterns 225R, second-second sensing vias 233T for electrically connecting the second-second sensing pads 223T to the third-second sensing pads 225T, and a second ground via 233G for electrically connecting the second ground pattern 223G to the third ground pattern 225G. The third conductive vias 235 may include third-first sensing vias 235R for electrically connecting the second-first sensing pads 223R to the first sensing patterns 225R, third-second sensing vias 235T for electrically connecting the second-second sensing pads 223T to the third-second sensing pads 225T, and a third ground via 235G for electrically connecting the second ground pattern 223G to the third ground pattern 225G.

The second conductive vias 233 may contact the second conductive layer 223, the third conductive vias 235 may contact the third conductive layer 225, and the second conductive vias 233 and the third conductive vias 235 may contact each other. Specifically, the second-first sensing pads 223R and the first sensing patterns 225R may be electrically connected by the second-first sensing vias 233R and third-first sensing vias 235R, which are vertically connected, and the second-second sensing pads 223T and the third-second sensing pads 225T may be electrically connected by the second-second sensing vias 233T and third-second sensing vias 235T, which are vertically connected, and the second ground pattern 223G and the third ground pattern 225G may be electrically connected by the second ground via 233G and third ground via 235G, which are vertically connected.

In some example embodiments, each of the second conductive vias 233 and the third conductive vias 235 may have a tapered structure in which the horizontal width decreases toward the center along the thickness direction of the base layer 211. In some example embodiments, the second conductive vias 233 and the third conductive vias 235 may have a minimum horizontal width at a contact surface therebetween.

The fourth conductive vias 237 may include fourth-second sensing vias 237T for electrically connecting the third-second sensing pads 225T to the second sensing patterns 227T, and a fourth ground via 237G for electrically connecting the third ground pattern 225G to the fourth ground pattern 227G. In some example embodiments, the fourth conductive vias 237 may have a tapered structure in which a horizontal width decreases toward the base layer 211.

The second substrate 200 may include a sensing region SR, a first contact region CR1, a second contact region CR2, a third contact region CR3, an interconnect region YR, and a peripheral region ER. Specifically, the sensing region SR may be a region in which first and second sensing patterns 225R and 227T for fingerprint recognition are disposed. The first contact region CR1 and the third contact region CR3 may be a region in which the first-first sensing vias 231R, the second-first sensing vias 233R, and the third-first sensing vias 235R are disposed for connection of the first sensing patterns 225R to the controller chip 310. The second contact region CR2 may be a region in which the first-second sensing vias 231T, the second-second sensing vias 233T, the third-second sensing vias 235T, and the fourth-second sensing vias 237T are disposed for connection of the second sensing patterns 227T and the controller chip 310. The interconnect region YR may be a region in which at least some of the first to fourth ground vias 231G, 233G, 235G, and 237G for connecting the fourth ground pattern 227G and the controller chip 310 are disposed. As shown, the second bonding pads 221B and the controller chip 310 may be on (e.g., directly or indirectly on) the lower surface of the lower insulating layer 213.

The sensing region SR may be disposed in the center of the second substrate 200. In some example embodiments, the sensing region SR may have a rectangular or square shape in a plan view. In the sensing region SR, a plurality of line-shaped first sensing patterns 225R spaced apart (e.g., isolated from direct contact with each other) in a first direction (X direction) and extending (e.g., extending in parallel with respect to each other) in a second direction (Y direction) intersecting (e.g., perpendicular to) the first direction and a plurality of line-shaped second sensing patterns 227T spaced apart (e.g., isolated from direct contact with each other) in the second direction (Y direction) and extending (e.g., extending in parallel with respect to each other) in the first direction (X direction) may be disposed, where the first and second sensing patterns 225R and 227T will be understood to be included in the second substrate 200 (e.g., included in the sensing region SR). As shown in at least FIGS. 2C-2D, the first and second sensing patterns 225R and 227T may be isolated from direct contact with each other in the third direction (Z direction).

A first contact region CR1 may be formed at one end of the sensing region SR in the second direction (Y direction), and a third contact region CR3 may be formed at the other end of the sensing region SR in the second direction (Y direction). In addition, a second contact region CR2 may be formed at one end of the sensing region SR in the first direction (X direction), and a interconnect region YR may be formed at the other end of the sensing region SR in the first direction (X direction).

The peripheral region ER may be disposed on an outer portion of the second substrate 200. The peripheral region ER may surround the sensing region SR in a plan view (e.g., in the first and second directions. Second bonding pads 221B may be disposed in the peripheral region ER. First to fourth ground patterns 221G, 223G, 225G, and 227G for providing a reference potential and shielding sensing noise may be disposed in the peripheral region ER and may be understood to collectively comprise a ground pattern surrounding the sensing region SR in a plan view (e.g., in the first and second directions).

The first sensing patterns 225R may extend between the sensing region SR and the first contact region CR1 or between the sensing region SR and the third contact region CR3. The first sensing patterns 225R may be connected to the controller chip 310 through the first-first sensing vias 231R, the second-first sensing vias 233R, and the third-first sensing vias 235R disposed in the first and third contact regions CR1 and CR3. In the first contact region CR1, each of the first-first sensing vias 231R, the second-first sensing vias 233R, and the third-first sensing vias 235R may be arranged in a first direction (X-direction). In addition, within the third contact region CR3, each of the first-first sensing vias 231R, the second-first sensing vias 233R, and the third-first sensing vias 235R may be arranged in a first direction (X-direction). Some of the first sensing patterns 225R may be connected to the first-first sensing vias 231R, the second-first sensing vias 233R, and the third-first sensing vias 235R disposed in the first contact region CR1. In addition, other portions of the first sensing patterns 225R may be connected to the first-first sensing vias 231R, the second-first sensing vias 233R, and the third-first sensing vias 235R disposed in the third contact region CR3. The adjacent first sensing patterns 225R may be electrically separated.

The second sensing patterns 227T may extend in the sensing region SR and the second contact region CR2. The second sensing patterns 227T may be connected to the controller chip 310 through the first-second sensing vias 231T, the second-second sensing vias 233T, the third-second sensing vias 235T, and the fourth-second sensing vias 237T disposed in the second contact region CR2. Each of the first-second sensing vias 231T, the second-second sensing vias 233T, the third-second sensing vias 235T, and the fourth-second sensing vias 237T may be staggered in a zigzag in the second direction (Y direction).

The first sensing patterns 225R may have a first width W1 that is a width in a first direction (X direction), and the second sensing patterns 227T may have a second width W2 that is a width in the second direction (Y direction). In some example embodiments, the first width W1 may be greater than the second width W2. For example, the first width W1 may be in a range of about 2 to about 4 times the second width W2. Specifically, the first width W1 may be in a range of about 40 μm to about 70 μm, and the second width W2 may be in a range of about 5 μm to about 25 μm.

A portion where the first sensing patterns 225R and the second sensing patterns 227T overlap in the third direction (Z direction) may constitute the pixels PX. The first pitch PIX in the first direction (X direction) between the centers PXC of the pixels PX may be substantially the same as the second pitch PIY in the second direction (Y direction) between the centers PXC of the pixels PX, but the present inventive concepts is not limited thereto. For example, each of the first pitch PIX and the second pitch PIY may be in a range of about 50 μm to about 90 μm.

The pixels PX may have an area capacitance AC due to the first sensing patterns 225R and the second sensing patterns 227T overlapping each other, and a combined capacitance value of a fringing capacitance defined by the first sensing patterns 225R and the second sensing patterns 227T.

When the user's fingerprint contacts the coating layer 140, by the capacitance induced between the second sensing patterns 227T and the user's fingerprint, a capacitance value corresponding to each of the pixels PX is changed. Because the change in the capacitance value is determined according to the shape of the user's fingerprint, the controller chip 310 may identify a user's fingerprint from a change in capacitance values of the pixels PX.

The fourth ground pattern 227G may surround the sensing region SR in which the second sensing patterns 227T are disposed in a plan view. The fourth ground pattern 227G may be at the same vertical level as the second sensing patterns 227T, and may surround the second sensing patterns 227T in a plan view. For example, the fourth ground pattern 227G continuously extends along the edge of the sensing region SR on the upper surface of the upper insulating layer 215 to surround the second sensing patterns 227T. The fourth ground pattern 227G may be disposed around the sensing region SR to reduce sensing noise while a user's fingerprint is in contact with the coating layer 140.

The base layer 211 may include an insulating material. The base layer 211 may include resin and glass fiber. The resin included in the base layer 211 may be at least one selected from a phenol resin, an epoxy resin, and a polyimide. In some example embodiments, the base layer 211 may include at least one material selected from Flame Retardant 4 (FR4), Tetrafunctional epoxy, Polyphenylene ether, Epoxy/polyphenylene oxide, Thermount, Bismaleimide triazine (BT), Cyanate ester, polyimide, prepreg, Ajinomoto Build-up Film (ABF), and liquid crystal polymer. In other embodiments, the base layer 211 may include silicon oxide, silicon nitride, silicon oxynitride, or a combination thereof. The glass fiber included in the base layer 211 is a reinforcing material, and may be formed through a focus treatment of a glass filament obtained by melt-spinning a glass material at a high temperature. The glass filament may be an ore processing product including silica as a main component.

Hereinafter, for convenience of description and understanding, components of the second substrate 200 will be described in an order close to the base layer 211.

The second conductive layer 223 may include second-first sensing pads 223R, second-second sensing pads 223T, and a second ground pattern 223G to which a reference potential is applied. The second ground pattern 223G may be disposed in the sensing region SR, the interconnect region YR, and the peripheral region ER. A portion of the second ground pattern 223G may overlap the first sensing patterns 225R and the second sensing patterns 227T in the third direction (Z direction). A portion of the second ground pattern 223G may be between the second sensing patterns 227T and the controller chip 310. Accordingly, the second ground pattern 223G may block external sensing noise from the controller chip 310. The second-first sensing pads 223R may be disposed in first and third contact regions CR1 and CR3, and the second-second sensing pads 223T may be disposed in a second contact region CR2. The second-first sensing pads 223R may provide a path for electrical connection between the first sensing patterns 225R and the controller chip 310, and the second-second sensing pads 223T may provide a path for electrical connection between the second sensing patterns 227T and the controller chip 310.

The lower insulating layer 213 may be disposed on the lower surface of the base layer 211 to cover the second conductive layer 223. The lower insulating layer 213 may electrically isolate the second-first sensing pads 223R, the second-second sensing pads 223T, and the second ground pattern 223G from each other.

The third conductive layer 225 may include a third ground pattern 225G to which a reference potential is applied, first sensing patterns 225R for recognizing a user's fingerprint, and third-second sensing pads 225T. The first sensing patterns 225R may be disposed in the sensing region SR, the third ground pattern 225G may be disposed in the interconnect region YR and the peripheral region ER, and the third-second sensing pads 225T may be disposed in the second contact region CR2. The third-second sensing pads 225T may provide a path for electrical connection between the second sensing patterns 227T and the controller chip 310.

The upper insulating layer 215 may be disposed on the upper surface of the base layer 211 to cover the third conductive layer 225. The upper insulating layer 215 may electrically isolate the first sensing patterns 225R, the third-second sensing pads 225T, and the third ground pattern 225G from each other.

The lower insulating layer 213 and the upper insulating layer 215 may include different materials. For example, the upper insulating layer 215 may include a material having a dielectric constant suitable for fingerprint recognition of the fingerprint sensor package 10. However, the present inventive concepts is not limited thereto, and the lower insulating layer 213 and the upper insulating layer 215 may include the same material.

Each of the lower insulating layer 213 and the upper insulating layer 215 may include at least one selected from a phenol resin, an epoxy resin, and a polyimide. In some example embodiments, each of the lower insulating layer 213 and the upper insulating layer 215 may include at least one selected from prepreg, FR4, quadrilateral epoxy, polyphenylene ether, epoxy/polyphenylene oxide, thermount, BT, cyanate ester, polyimide, and liquid crystal polymer.

The fourth conductive layer 227 may be disposed on the upper surface of the upper insulating layer 215. The fourth conductive layer 227 may include a fourth ground pattern 227G for removing sensing noise and second sensing patterns 227T for recognizing a user's fingerprint. The second sensing patterns 227T may be disposed in the sensing region SR, and the fourth ground pattern 227G may be disposed in the peripheral region ER.

As shown in FIGS. 2C-2D, the second substrate 200 may include the first ground pattern 221G on (e.g., directly or indirectly on) the lower surface of the lower insulating layer 213, the second ground pattern 223G on (e.g., directly or indirectly on) the lower surface of the base layer 211 and electrically connected to the first ground pattern 221G, the third ground pattern 225G on (e.g., directly or indirectly on) the upper surface of the base layer 211 and electrically connected to the second ground pattern 223G, and the fourth ground pattern 227G on (e.g., directly or indirectly on) the upper surface of the upper insulating layer 215 and electrically connected to the third ground pattern 225G, wherein the fourth ground pattern 227G surrounds the second sensing patterns 227T in a plan view (e.g., the first and second directions).

As further shown in FIGS. 2C-2D, the second substrate may include first conductive vias 231 extending in the third direction in the lower insulating layer 213, second conductive vias 233 extending in the third direction in the base layer 211 and coupled to the first conductive vias 231, third conductive vias 235 extending in the third direction in the base layer 211 and coupled to the second conductive vias 233, and fourth conductive vias 237 extending in the third direction in the upper insulating layer 215 and coupled to the third conductive vias 235, wherein the first to fourth conductive vias electrically connect the first ground pattern 221G and the fourth ground pattern 227G, and wherein the first to fourth conductive vias are tapered toward a center in a thickness direction of the base layer 211.

The second sensing patterns 227T may be spaced apart from the first sensing patterns 225R in a third direction (Z direction) with the upper insulating layer 215 therebetween. That is, the second sensing patterns 227T may be electrically insulated from the first sensing patterns 225R by the upper insulating layer 215. Accordingly, the first sensing patterns 225R may constitute the first electrode of the capacitor, the upper insulating layer 215 may constitute a dielectric layer of the capacitor, and the second sensing patterns 227T may constitute a second electrode of the capacitor. Accordingly, the first sensing patterns 225R and the second sensing patterns 227T may collectively comprise (e.g., constitute) a plurality of capacitors. That is, capacitors constituting the fingerprint sensor may be formed in the second substrate 200.

The upper protective layer 219 may be disposed on the upper surface of the upper insulating layer 215 to cover the fourth conductive layer 227.

The first conductive layer 221 may be disposed on the lower surface of the lower insulating layer 213. The first conductive layer 221 may include second bonding pads 221B, first-first sensing pads 221R, first-second sensing pads 221T, and a first ground pattern 221G to which a reference potential is applied.

The second bonding pads 221B may be connected to the conductive wires 340, and may be electrically connected to the first bonding pads 120 of the first substrate 100 through the conductive wires 340. The second bonding pads 221B may include a power pad to which power (e.g., power potential) provided from an external device is applied, a ground pad to which a reference potential is applied, and an output pad for outputting the fingerprint recognition result of the fingerprint sensor package 10 to the outside (e.g., the display unit 12 of the smart card 1 of FIG. 1). The controller chip 310 may receive the power potential through some of the second bonding pads 221B and the power supply pattern 221P, and may receive the reference potential through some of the second bonding pads 221B and the first ground pattern 221G. Also, the controller chip 310 may receive signals recognized by the first and second sensing patterns 225R and 227T through the first-first sensing pads 221R and the first-second sensing pads 221T.

As shown in at least FIG. 2C, distances 225RD at which the first sensing patterns 225R are isolated from direct contact with the first substrate 100 and distances 227TD at which the second sensing patterns 227T are isolated from direct contact with the first substrate 100 are less than a distance 221BD at which the second bonding pads 221B are isolated from direct contact with the first substrate 100.

The first-first sensing pads 221R may extend from the first and third contact regions CR1 and CR3 to a portion overlapping the controller chip 310 in a third direction (Z direction), and the first-second sensing pads 221T may extend from the second contact region CR2 to a portion overlapping the controller chip 310 in the third direction (Z direction). The first-first sensing pads 221R may provide a path for electrical connection between the first sensing patterns 225R and the controller chip 310, and the first-second sensing pads 221T may provide a path for electrical connection between the second sensing patterns 227T and the controller chip 310.

The lower protective layer 217 may be disposed on the lower surface of the lower insulating layer 213 to cover at least a portion of the first conductive layer 221. In some example embodiments, the lower protective layer 217 may be formed to cover a portion of a lower surface of the lower insulating layer 213. In some example embodiments, the lower protective layer 217 may be formed to entirely cover the lower surface of the lower insulating layer 213.

Each of the lower protective layer 217 and the upper protective layer 219 may be an insulating coating layer 140. In some example embodiments, the lower protective layer 217 and the upper protective layer 219 may be solder resist. In other embodiments, the lower protective layer 217 and the upper protective layer 219 may include a polymer material having excellent heat resistance, insulating properties, and mechanical strength. For example, each of the lower protective layer 217 and the upper protective layer 219 may include polyimide, polyamide, polyacetal, polycarbonate, or the like.

The controller chip 310 and the passive element 320 may be disposed on the lower surface of the second substrate 200. The controller chip 310 may be mounted on the lower surface of the second substrate 200 in a flip-chip manner. Connection bumps 315 for electrically and physically connecting the controller chip 310 to the second substrate 200 may be disposed between the controller chip 310 and the second substrate 200. The connection bumps 315 may be disposed between some patterns of the first conductive layer 221 and the chip pads 311 of the controller chip 310.

In some example embodiments, the controller chip 310 may be entirely or partially disposed within the sensing region SR. In other embodiments, the controller chip 310 may be entirely disposed outside the sensing region SR Like a memory chip and/or a processor chip, the controller chip 310 may include any configuration required to perform an operation for recognizing a user's fingerprint from a change in capacitance of the pixels PX. In addition, the passive element 320 may include, for example, a multi-layer ceramic capacitor (MLCC), but is not limited thereto.

The molding layer 350 may be disposed on the first substrate 100 (e.g., directly or indirectly on the second surface 113 of the core insulating layer 110) and the second substrate 200. As shown in at least FIGS. 2C-2D, the molding layer 350 may cover (e.g., enclose and/or overlap in the first, second, and third directions) the second substrate 200, the controller chip 310, and the passive element 320. The molding layer 350 may protect the second substrate 200, the controller chip 310, and the passive element 320 from external influences such as contamination and impact. In addition, the molding layer 350 may cover (e.g., enclose and/or overlap in the first, second, and third directions) the first bonding pads 120 disposed on the second surface 113 of the core insulating layer 110, but not cover the external connection pads 130 to be exposed to the outside (e.g., the external connection pads 130 may be exposed from the molding layer 350, for example as shown in at least FIGS. 2C-2D). For example, as shown in at least FIGS. 2C-2D, the molding layer 350 may be isolated from direct contact with the external connection pads 130. The molding layer 350 may extend along a boundary 199 between the region in which the first bonding pads 120 are disposed and the region in which the external connection pads 130 are disposed, on the second surface 113 of the core insulating layer 110. As shown in at least FIGS. 2C-2D, the molding layer 350 may extend laterally (e.g., in the first and/or second direction) from one or more side surfaces 200ss of the second substrate 200 to cover the first bonding pad 120, but may be spaced apart from the external connection pads 130. For example, as shown in at least FIGS. 2C-2D the molding layer 350 may extend laterally (e.g., in the first and/or second direction) from one or more side surfaces 200ss of the second substrate

200 to the boundary 199 (which may extend in at least the third direction as shown) between the first bonding pads 120 and the external connection pads 130.

The molding layer 350 may be formed of an epoxy molding compound. Alternatively, the molding layer 350 may be formed of an epoxy-based material, a thermosetting material, a thermoplastic material, a UV-treated material, or the like.

Because the sensing region SR corresponding to the fingerprint recognition sensor is included in the second substrate 200 itself, the total thickness may be reduced, and the fingerprint sensor package 10 according to the technical concept of the present inventive concepts may be used for manufacturing a smart card having a thickness equivalent to that of a conventional credit card and check card.

Figure 3:
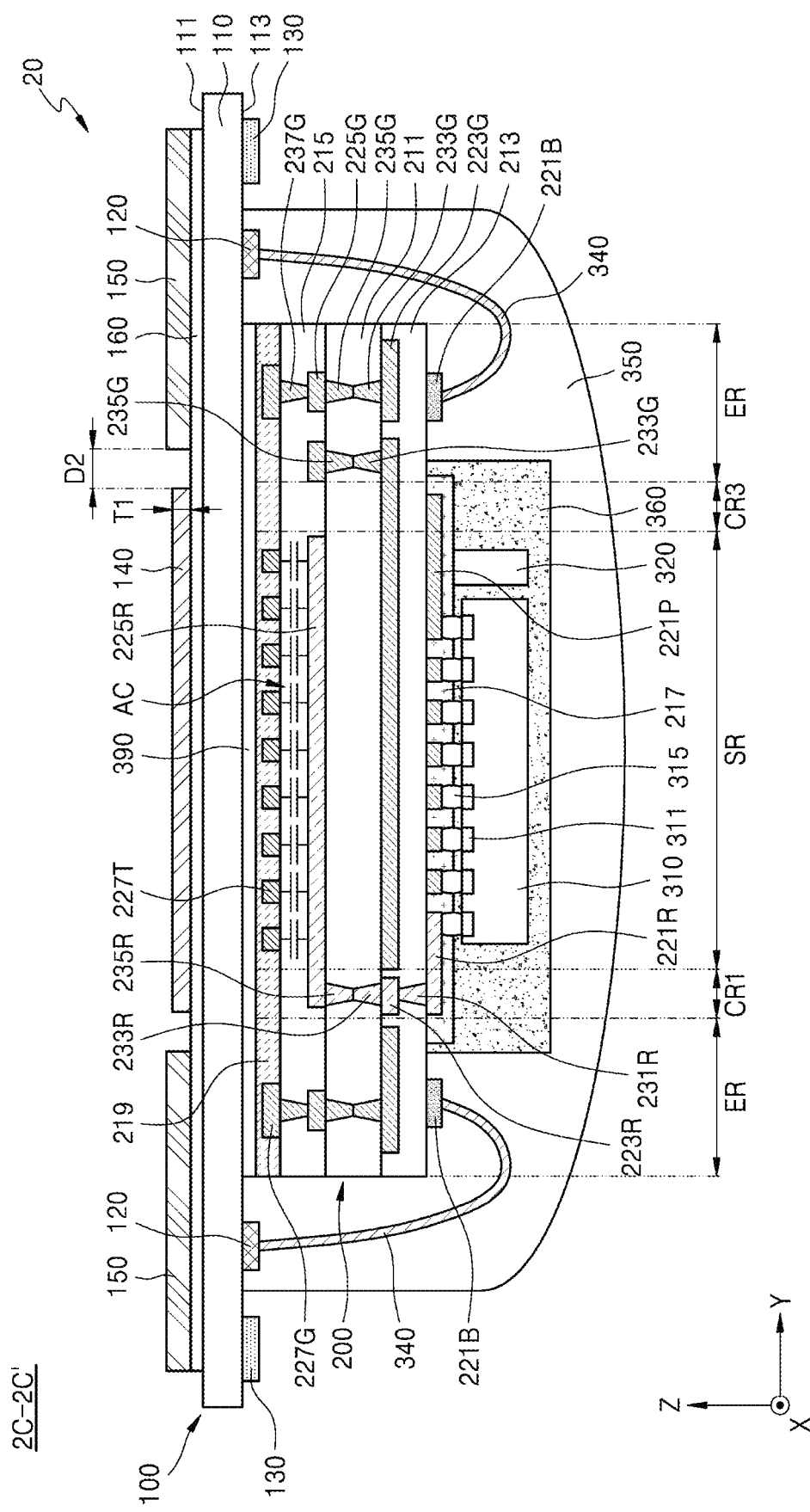
FIG. 3 is a cross-sectional view illustrating a fingerprint sensor package according to some example embodiments of the present inventive concepts.
Figure 4:
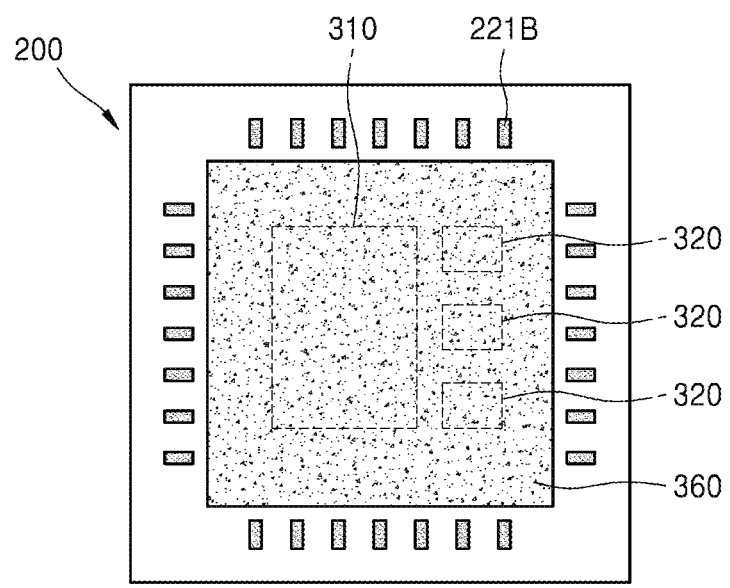
FIGS. 4 and 5 are bottom views of an inner molding layer of a fingerprint sensor package 20 shown in FIG. 3, respectively.
Figure 5:
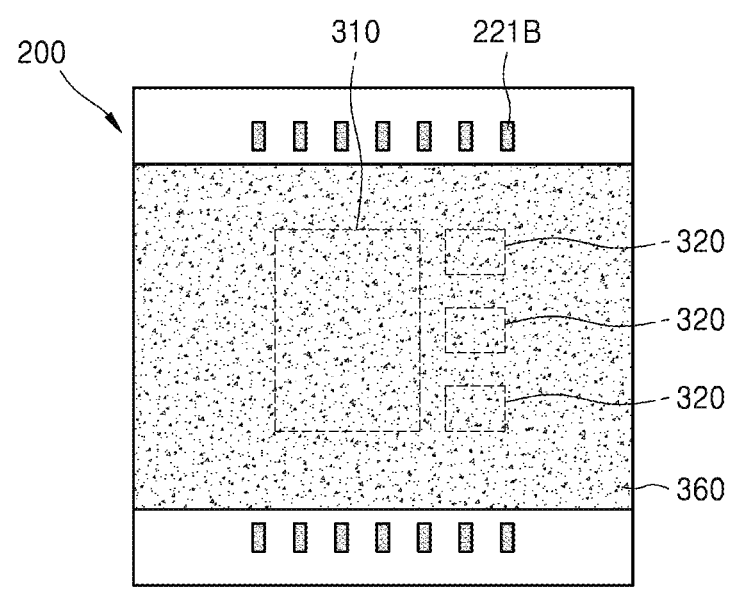

FIG. 3 is a cross-sectional view illustrating a fingerprint sensor package 20 according to some example embodiments of the present inventive concepts. FIGS. 4 and 5 are bottom views of the inner molding layer 360 of the fingerprint sensor package 20 shown in FIG. 3, respectively.

The fingerprint sensor package 20 shown in FIG. 3 may be substantially the same as or similar to the fingerprint sensor package 10 described with reference to FIGS. 2A to 2E except that the fingerprint sensor package 20 further includes the inner molding layer 360. Hereinafter, the fingerprint sensor package 20 of FIG. 3 will be described with a focus on differences from the fingerprint sensor package 10 described with reference to FIGS. 2A to 2E.

Referring to FIG. 3, the inner molding layer 360 may be disposed on the lower surface of the second substrate 200 to cover (e.g., enclose and/or overlap in the first, second, and third directions) the controller chip 310 and the passive element 320. In the manufacturing process of the fingerprint sensor package 20, the molding layer 350 may be formed after the inner molding layer 360 is formed. As shown in at least FIG. 3, the inner molding layer 360 may be formed on the lower surface of the second substrate 200 to cover (e.g., enclose and/or overlap in the first, second, and third directions) the controller chip 310 and the passive element 320, and the molding layer 350 may be formed to cover (e.g., enclose and/or overlap in the first, second, and third directions) the inner molding layer 360. The inner molding layer 360 may be between the controller chip 310 and the molding layer 350, and between the passive element 320 and the molding layer 350. The inner molding layer 360 may be formed of an epoxy molding compound. Alternatively, the inner molding layer 360 may be formed of an epoxy-based material, a thermosetting material, a thermoplastic material, a UV-treated material, or the like. In some example embodiments, the molding layer 350 may be formed of a transparent material or a semi-transparent material. As the molding layer 350 is formed of a transparent material or a semi-transparent material, the shape of the inner molding layer 360 may be confirmed from the outside.

In some example embodiments, as illustrated in FIG. 4, the inner molding layer 360 may be formed to cover a partial region of the lower surface of the second substrate 200, and may be spaced apart from edges of the lower surface of the second substrate 200. The inner molding layer 360 may not cover the region in which the second bonding pads 221B are disposed.

In some example embodiments, as illustrated in FIG. 5, when the lower surface of the second substrate 200 has a first edge and a second edge opposite to each other, the inner molding layer 360 may extend between the first edge and the second edge of the lower surface of the second substrate 200. For example, the inner molding layer 360 may extend in the second direction (Y direction) from the first edge to the second edge of the lower surface of the second substrate 200.

Figure 6:
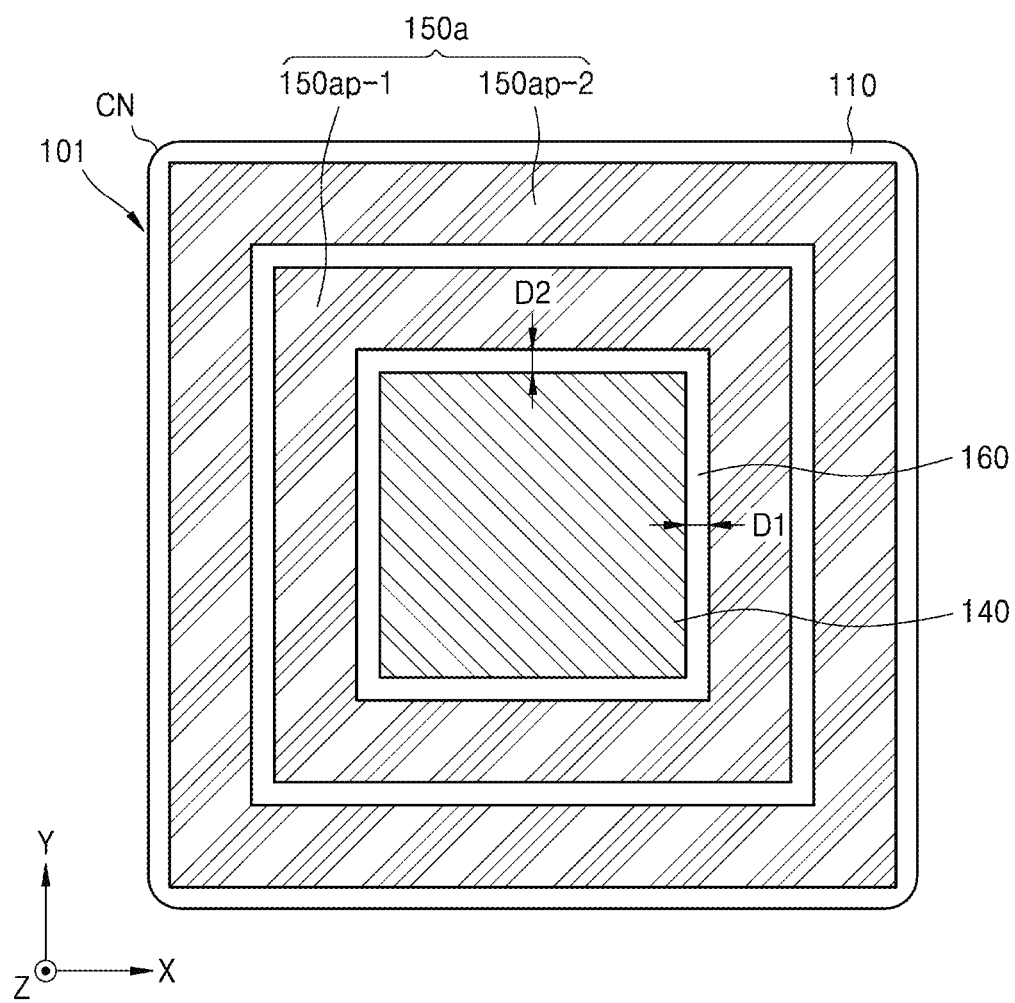
FIGS. 6 and 7 are plan views showing a first substrate of a fingerprint sensor package according to some example embodiments of the present inventive concepts, respectively.
Figure 7:
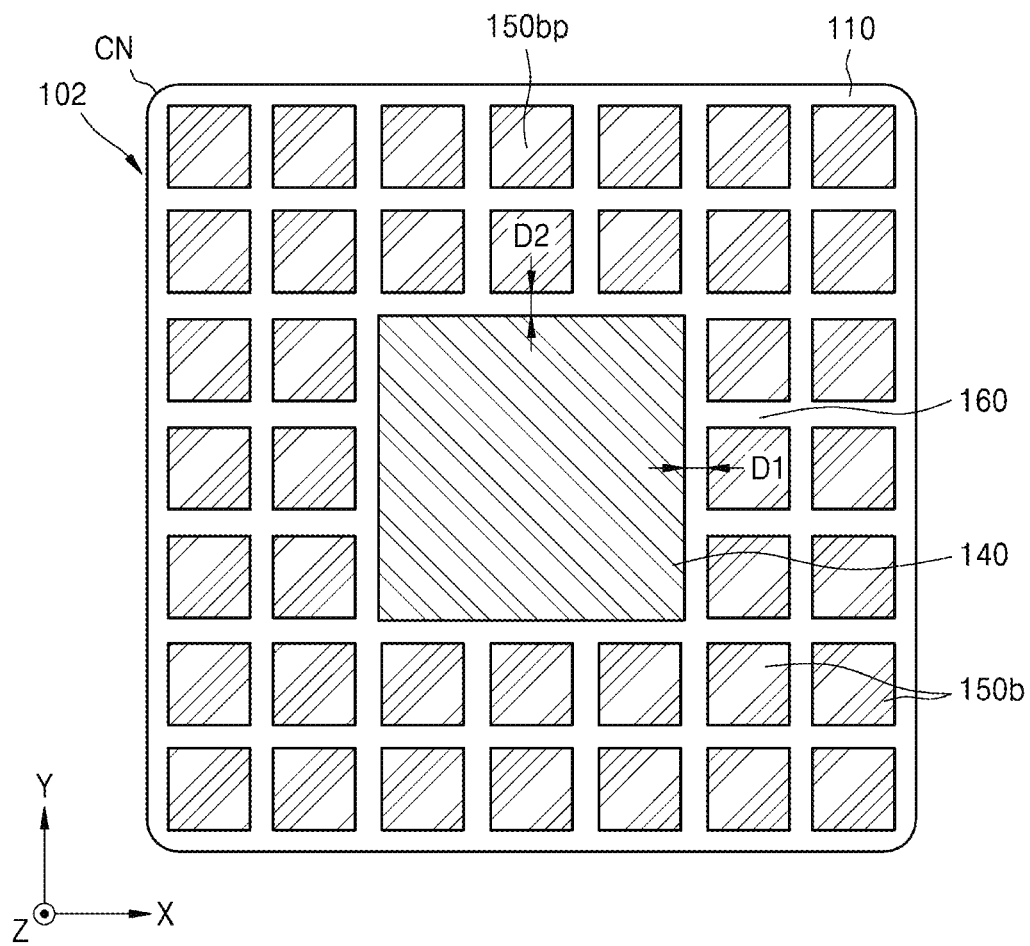

FIGS. 6 and 7 are plan views showing a first substrate of a fingerprint sensor package according to some example embodiments of the present inventive concepts, respectively.

Referring to FIG. 6, the first substrate 101 may include a coating layer 140 and a ground bezel 150*a* disposed on the first surface of the core insulating layer 110.

As shown in at least FIG. 6, ground bezel 150*a* may include a plurality of closed line patterns 150*ap*-1, 150*ap*-2 spaced apart from each other. Each of the plurality of closed line patterns 150*ap*-1, 150*ap*-2 may extend along the circumference of the coating layer 140 (e.g., in a periphery of the coating layer 140) and surround the coating layer 140 in a plan view (e.g., in the first and second directions). In some example embodiments, the number of closed line patterns 150*ap*-1, 150*ap*-2 constituting the plurality of closed line patterns is not limited to the illustrated two, but may be three or more.

A distance from the edge of the coating layer 140 to the ground bezel 150*a* may be spaced apart by a first distance D1 along the first direction (X direction), and may be spaced apart by a second distance D2 in the second direction (Y direction). In some example embodiments, the first distance D1 may be substantially the same as the second distance D2.

Referring to FIG. 7, the first substrate 102 may include a coating layer 140 and a ground bezel 150*b* disposed on the first surface of the core insulating layer 110.

As shown in FIG. 7 ground bezel 150*b* may include a plurality of sub-patterns 150*bp* spaced apart from each other (e.g., isolated from direct contact with each other). As shown in FIG. 7, the plurality of sub-patterns 150*bp* may be arranged (e.g., may collectively extend) along the side surface of the coating layer 140. Each of the plurality of sub-patterns 150*bp* may have a rectangular shape in a plan view. For example, the planar shape of the plurality of sub-patterns 150*bp* may be a rectangular shape, a square shape, or a rhombus shape. In some example embodiments, the planar shape of the plurality of sub-patterns 150*bp* may be a circle or a polygon such as a pentagon.

A distance from the edge of the coating layer 140 to the ground bezel 150*b* may be spaced apart by a first distance D1 along the first direction (X direction), and may be spaced apart by a second distance D2 in the second direction (Y direction). In some example embodiments, the first distance D1 may be substantially the same as the second distance D2.

Figure 8:
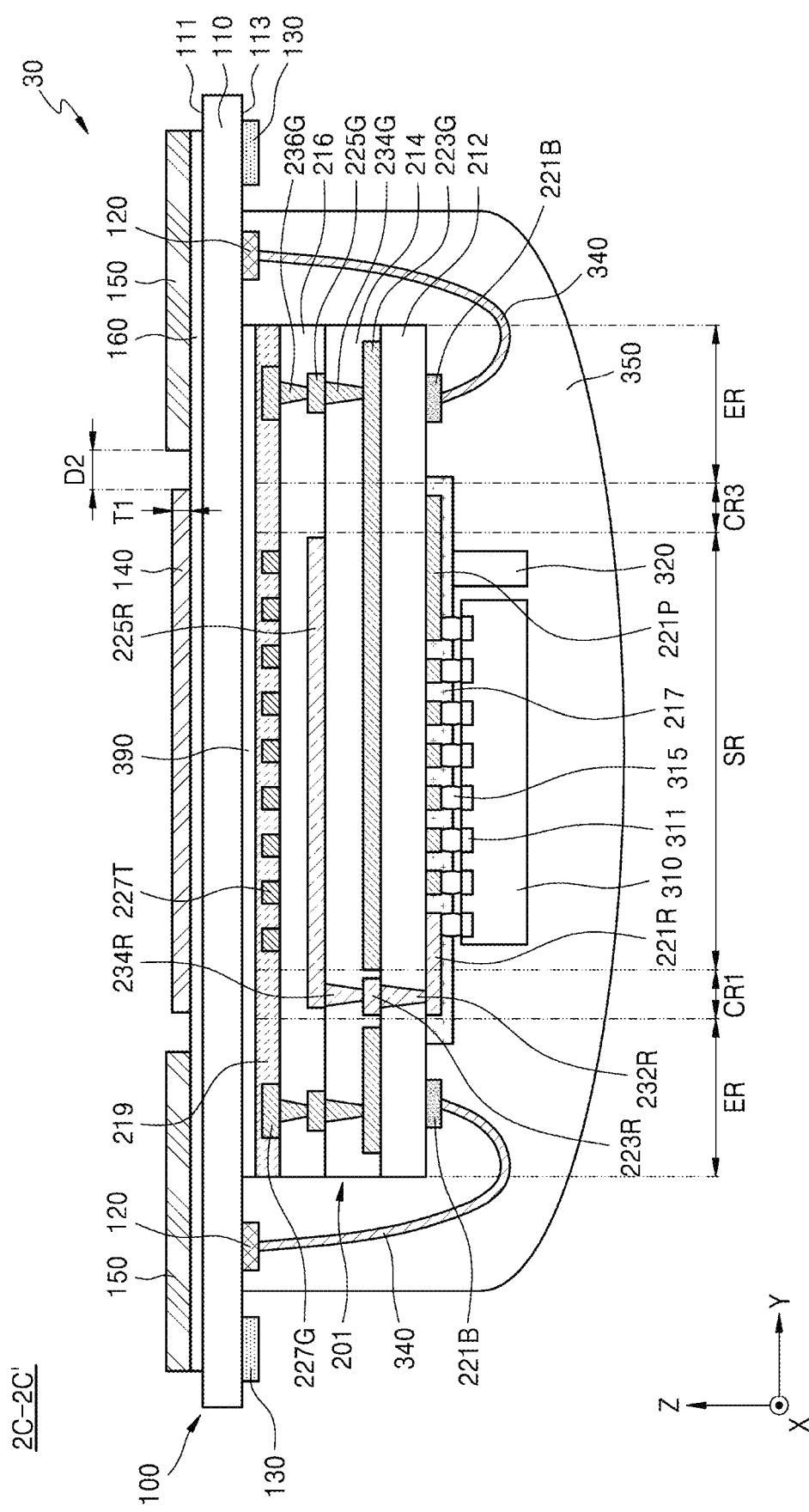
FIG. 8 is a cross-sectional view illustrating a fingerprint sensor package according to some example embodiments of the present inventive concepts.

FIG. 8 is a cross-sectional view illustrating a fingerprint sensor package 30 according to some example embodiments of the present inventive concepts.

Except for the second substrate 201, the fingerprint sensor package 30 shown in FIG. 8 may be substantially the same as or similar to the fingerprint sensor package 10 described with reference to FIGS. 2A to 2E. Hereinafter, the fingerprint sensor package 30 of FIG. 8 will be described with a focus on differences from the fingerprint sensor package 10 described with reference to FIGS. 2A to 2E.

Referring to FIG. 8, the fingerprint sensor package 30 may include a first substrate 100, a second substrate 201, a controller chip 310, a passive element 320, and a molding layer 350.

The second substrate 201 may not include a base layer. The second substrate 201 is an insulating material and may include first to third insulating layers 212, 214, and 216. The second substrate 201 may include first conductive vias 232R in the first insulating layer 212, second conductive vias 234G and 234R in the second insulating layer 214, and third conductive vias 236G in the third insulating layer 216. The first conductive vias 232R, the second conductive vias 234G and 234R, and the third conductive vias 236G may have a tapered structure toward the lower surface of the second substrate 201 in contact with the controller chip 310.

The first insulating layer 212 may be disposed on the lower protective layer 217. The first conductive vias 232R penetrate the first insulating layer 212 to contact the first conductive layers 221B, 221R, and 221P on the lower surface of the first insulating layer 212 and the second conductive layers 223G and 223R on the upper surface of the first insulating layer 212.

The second insulating layer 214 may be disposed on the first insulating layer 212. The second conductive layers 223G and 223R may be covered by the second insulating layer 214. The second conductive vias 234G and 234R penetrate at least a portion of the second insulating layer 214 to contact the second conductive layers 223G and 223R on the upper surface of the first insulating layer 212 and the third conductive layers 225G and 225R on the upper surface of the second insulating layer 214.

The third insulating layer 216 may be disposed on the second insulating layer 214. The third conductive layers 225G and 225R may be covered by the third insulating layer 216. Third conductive vias 236G and 236T penetrate at least a portion of the third insulating layer 216 to contact the third conductive layers 225G and 225R on the upper surface of the second insulating layer 214 and the fourth conductive layers 227G and 227T on the upper surface of the third insulating layer 216.

Figure 9:
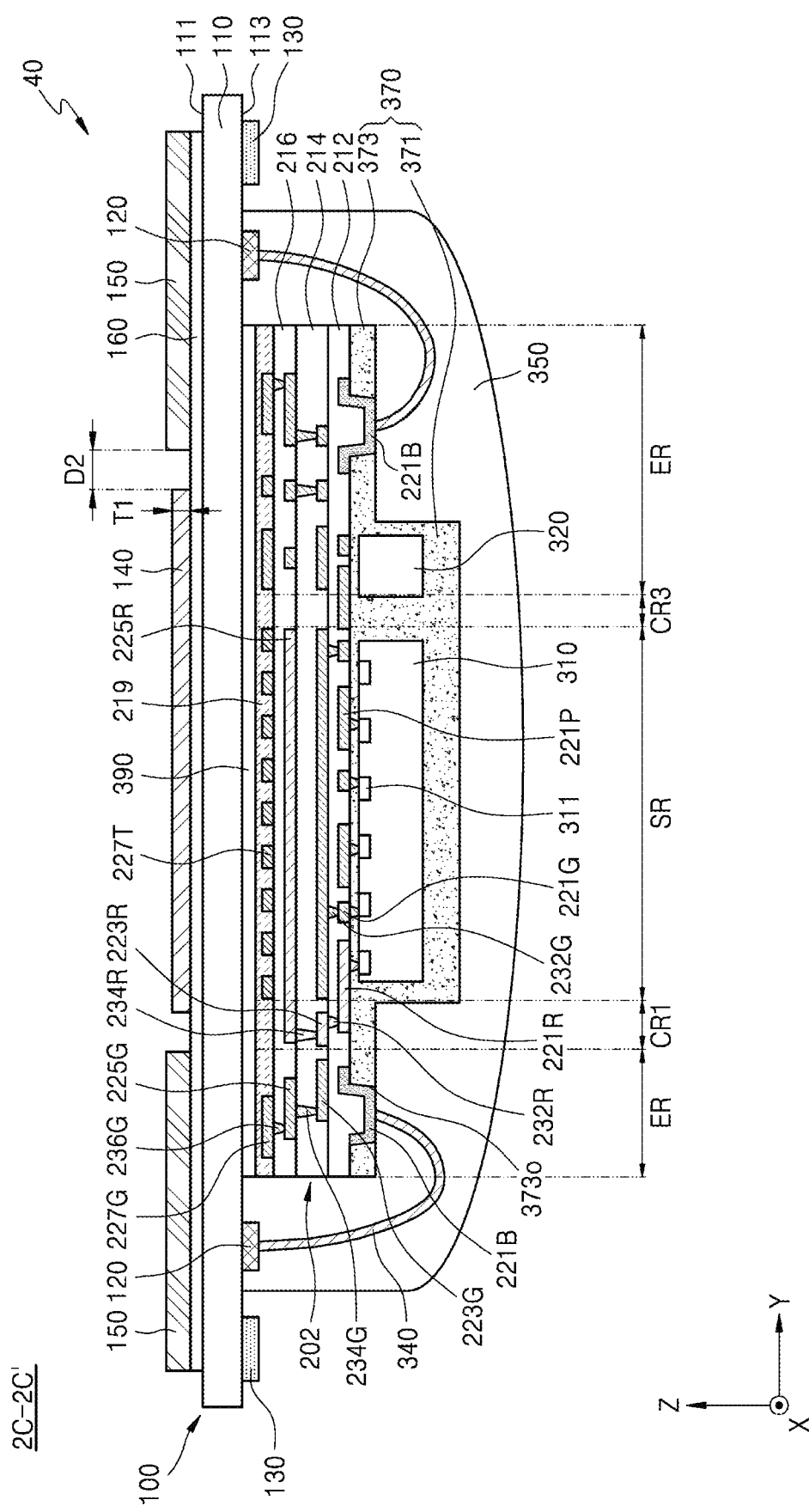
FIG. 9 is a cross-sectional view illustrating a fingerprint sensor package according to some example embodiments of the present inventive concepts.

FIG. 9 is a cross-sectional view illustrating a fingerprint sensor package 40 according to some example embodiments of the present inventive concepts.

Except for the second substrate 202, the fingerprint sensor package 40 shown in FIG. 9 may be substantially the same as or similar to the fingerprint sensor package 10 described with reference to FIGS. 2A to 2E. Hereinafter, the fingerprint sensor package 40 of FIG. 9 will be described with a focus on differences from the fingerprint sensor package 10 described with reference to FIGS. 2A to 2E.

Referring to FIG. 9, the fingerprint sensor package 40 includes a first substrate 100, a second substrate 202, a controller chip 310, a passive element 320, a conductive wire 340, a molding layer 350, and an inner molding layer 370. The fingerprint sensor package 40 may have a Fan-Out Wafer Level Package (FO-WLP) structure.

The second substrate 202 may not include a base layer. The second substrate 202 may include first to third insulating layers 212, 214, and 216 sequentially stacked and a wiring structure. The wiring structure may include first conductive layers 221B, 221G, 221P, and 221R, second conductive layers 223G and 223R, third conductive layers 225G and 225R, and fourth conductive layers 227G and 227T. In addition, the wiring structure may include first conductive vias 232G and 232R, second conductive vias 234G and 234R, and third conductive vias 236G having a structure that is tapered toward the controller chip 310. In some example embodiments, the wiring structure may be formed by a dual damascene process.

The inner molding layer 370 may include a step difference formed by partially removing the flat mold material layer. The inner molding layer 370 may include a first molding part 371 protecting the controller chip 310 and the passive element 320 and a second molding part 373 surrounding the first molding part 371. The second molding part 373 may extend along a lower surface of the first insulating layer 212.

The second bonding pad 221B may be exposed through an opening (e.g., may be in an opening 373o of) the second molding part 373. For example, the second bonding pad 221B may be disposed in an opening formed in the second molding part 373. A first segment of the second bonding pad 221B may extend on an upper surface of the second molding part 373 in contact with the first insulating layer 212, and a second segment of the second bonding pad 221B may extend along an inner wall of the second molding part 373 defining an opening formed in the second molding part 373, and a third segment of the second bonding pad 221B may extend at the same level as the bottom surface of the second molding part 373. The conductive wire 340 may be connected to the third segment of the second bonding pad 221B.

FIGS. 10A to 10F are diagrams sequentially illustrating a method of manufacturing a smart card according to some example embodiments of the present inventive concepts.

Figure 10A:
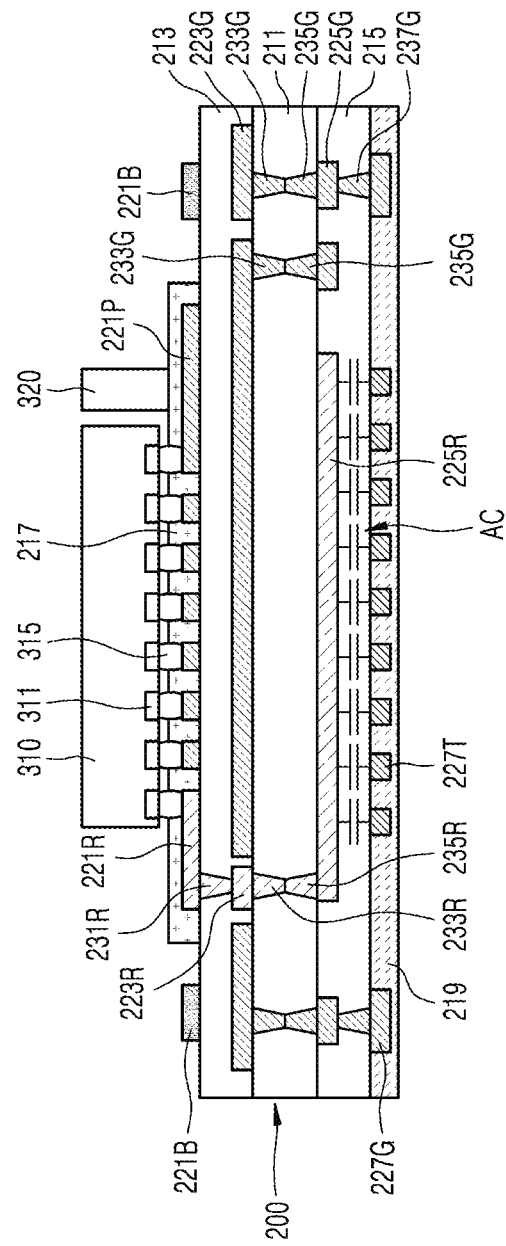
FIGS. 10A, 10B, 10C, 10D, 10E, and 10F are diagrams sequentially illustrating a method of manufacturing a smart card according to some example embodiments of the present inventive concepts.

Referring to FIG. 10A, the second substrate 200 is prepared, and the controller chip 310 and the passive element 320 are mounted on the second substrate 200. The controller chip 310 may be mounted on the second substrate 200 by a flip chip method.

Figure 10B:
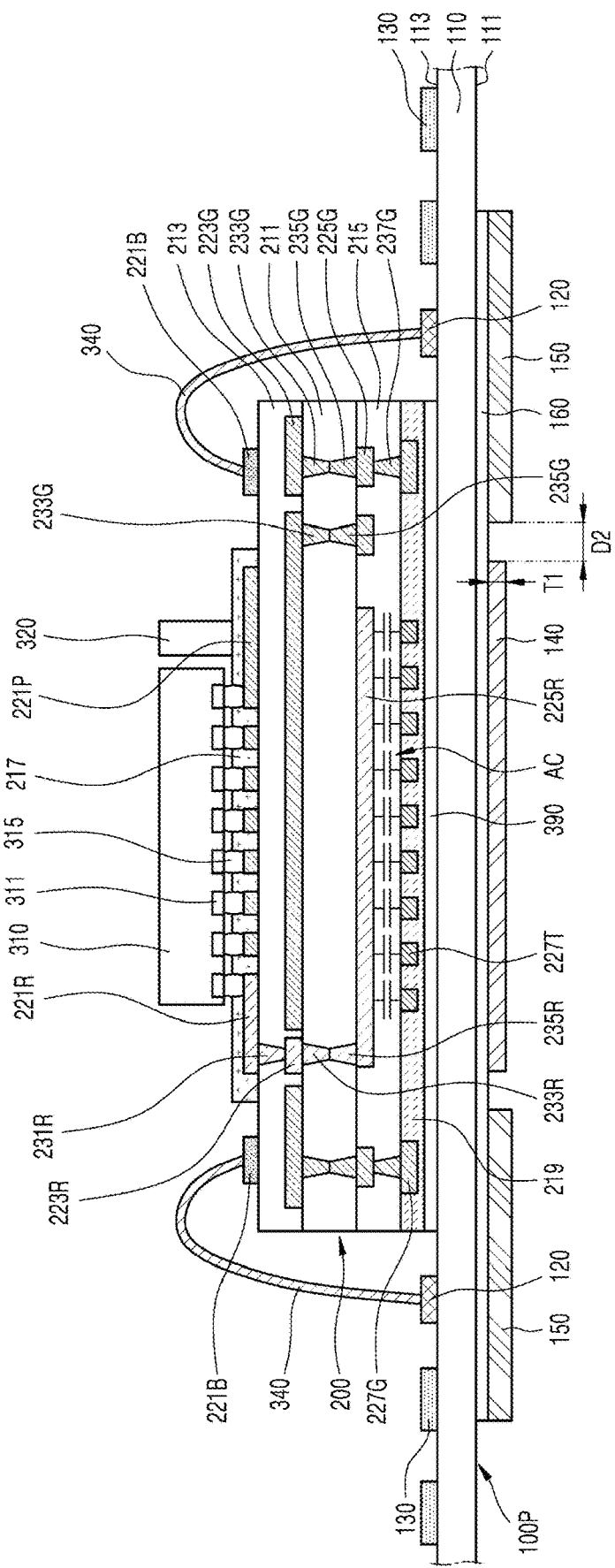

Referring to FIG. 10B, a first panel substrate 100P on which the second substrate 200 will be mounted is prepared. Most of the components constituting the first panel substrate 100P and materials constituting the components are substantially the same as or similar to those of the first substrate 100 of the fingerprint sensor package 10 described with reference to FIGS. 2A to 2E. However, the first panel substrate 100P may have a larger plan area than the first substrate 100 so that the plurality of second substrates 200 may be mounted thereon. The first panel substrate 100P may be mounted on a winding reel facility, and reeling and releasing of the first panel substrate 100P may be controlled by the winding reel facility.

After preparing the first panel substrate 100P, the second substrate 200 is mounted on the mounting region of the second surface 113 of the core insulating layer 110. The second substrate 200 may be fixed on the first panel substrate 100P by the substrate adhesive layer 390.

After the second substrate 200 is disposed on the first panel substrate 100P, a conductive wire 340 for electrically connecting the first panel substrate 100P and the second substrate 200 is formed. The conductive wire 340 may extend between the first bonding pad 120 of the first panel substrate 100P and the second bonding pad 221B of the second substrate 200. The conductive wire 340 may be formed through a wire bonding process.

Figure 10C:
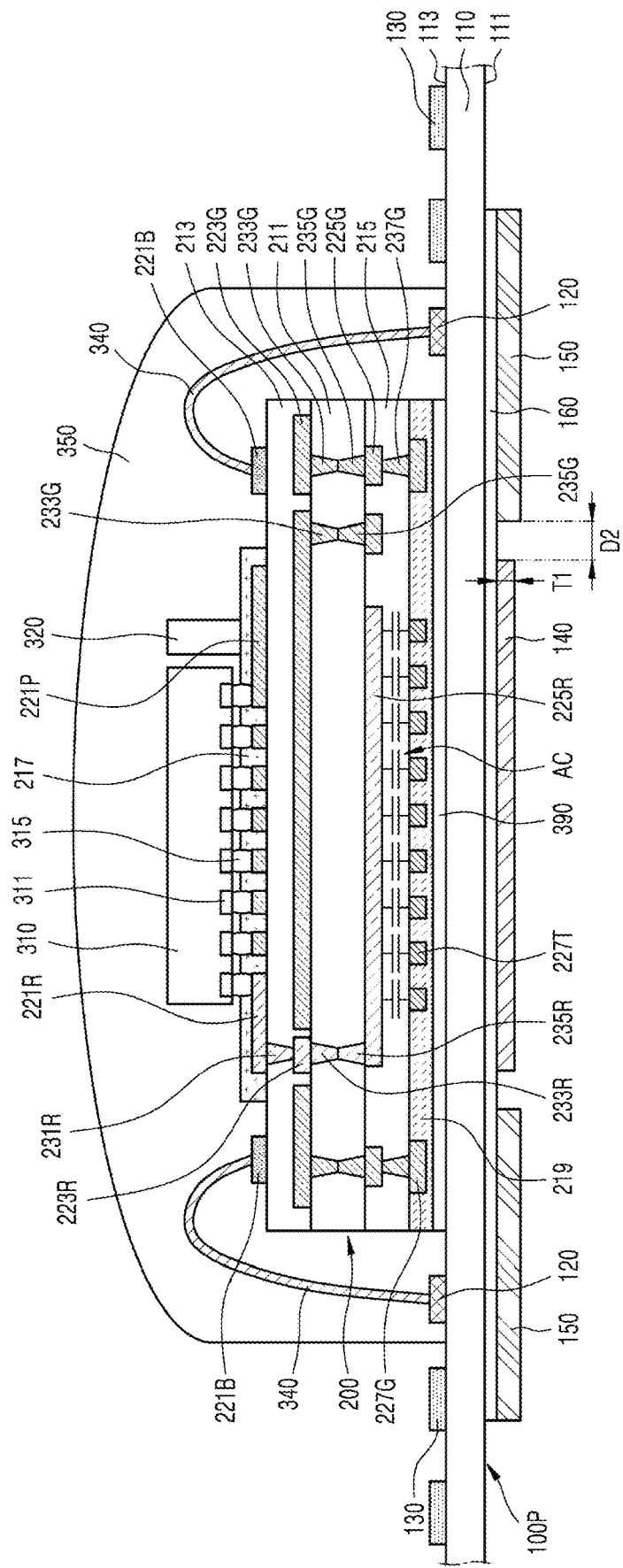

Referring to FIG. 10C, a molding layer 350 is formed on the second surface 113 of the core insulating layer 110. The molding layer 350 may cover the second substrate 200, the controller chip 310, the passive element 320, and the conductive wire 340. In addition, the molding layer 350 may cover the first bonding pad 120 of the first panel substrate 100P, but may not cover the external connection pad 130. That is, the molding layer 350 may extend laterally along the second surface 113 of the core insulating layer 110 from the side surface of the second substrate 200 to the boundary between the first bonding pad 120 and the external connection terminal.

Figure 10D:
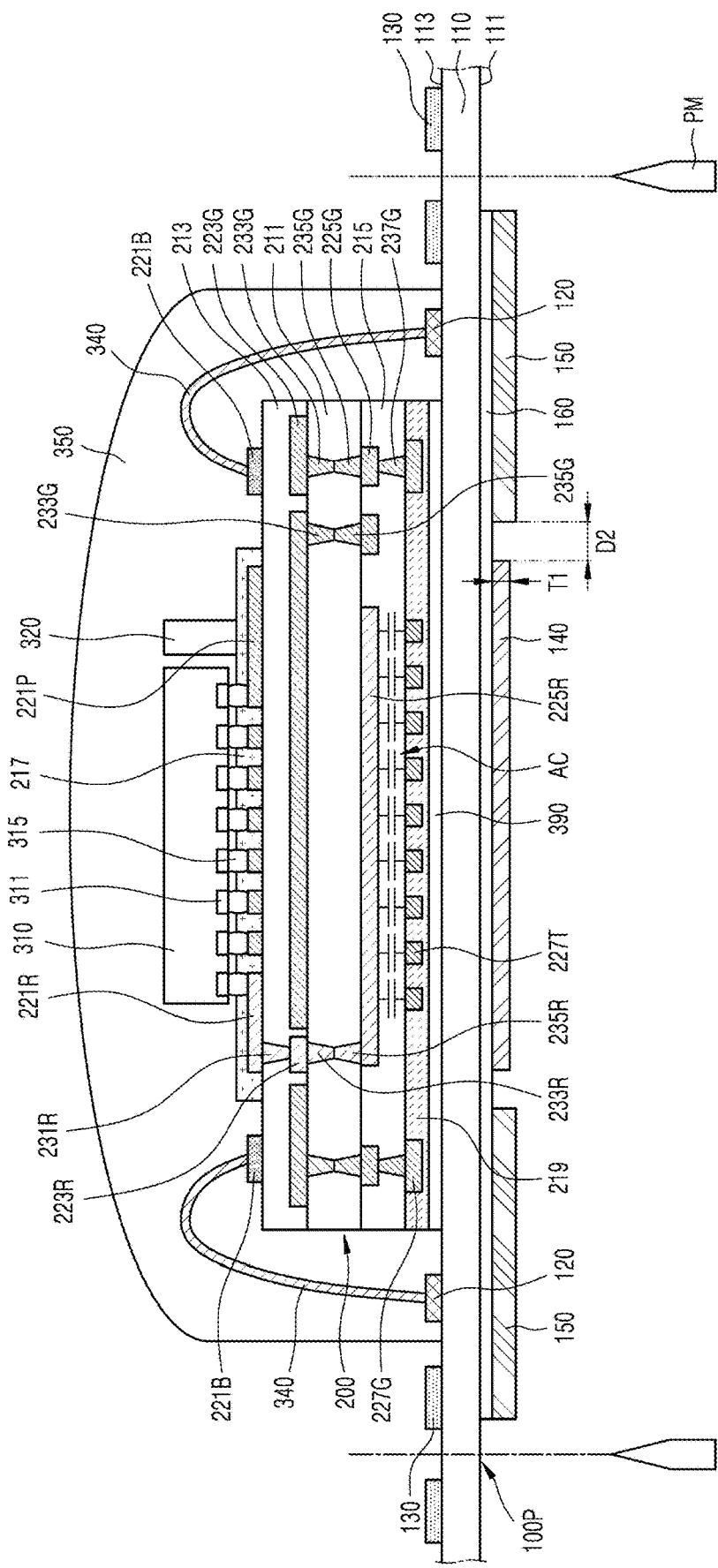

Referring to FIG. 10D, the first panel substrate 100P may be cut using the punching facility PM. The punching facility PM may cut the first panel substrate 100P to form the fingerprint sensor package 10 described with reference to FIGS. 2A to 2E. As the first panel substrate 100P is cut, a plurality of first substrates 100 in FIG. 2C may be formed from the first panel substrate 100P. In order to efficiently prevent cracks that may occur in the process of cutting the first panel substrate 100P using the punching facility PM, the punching facility PM may cut the first panel substrate 100P so that the corners of the first substrate 100 have a round shape.

Figure 10E:
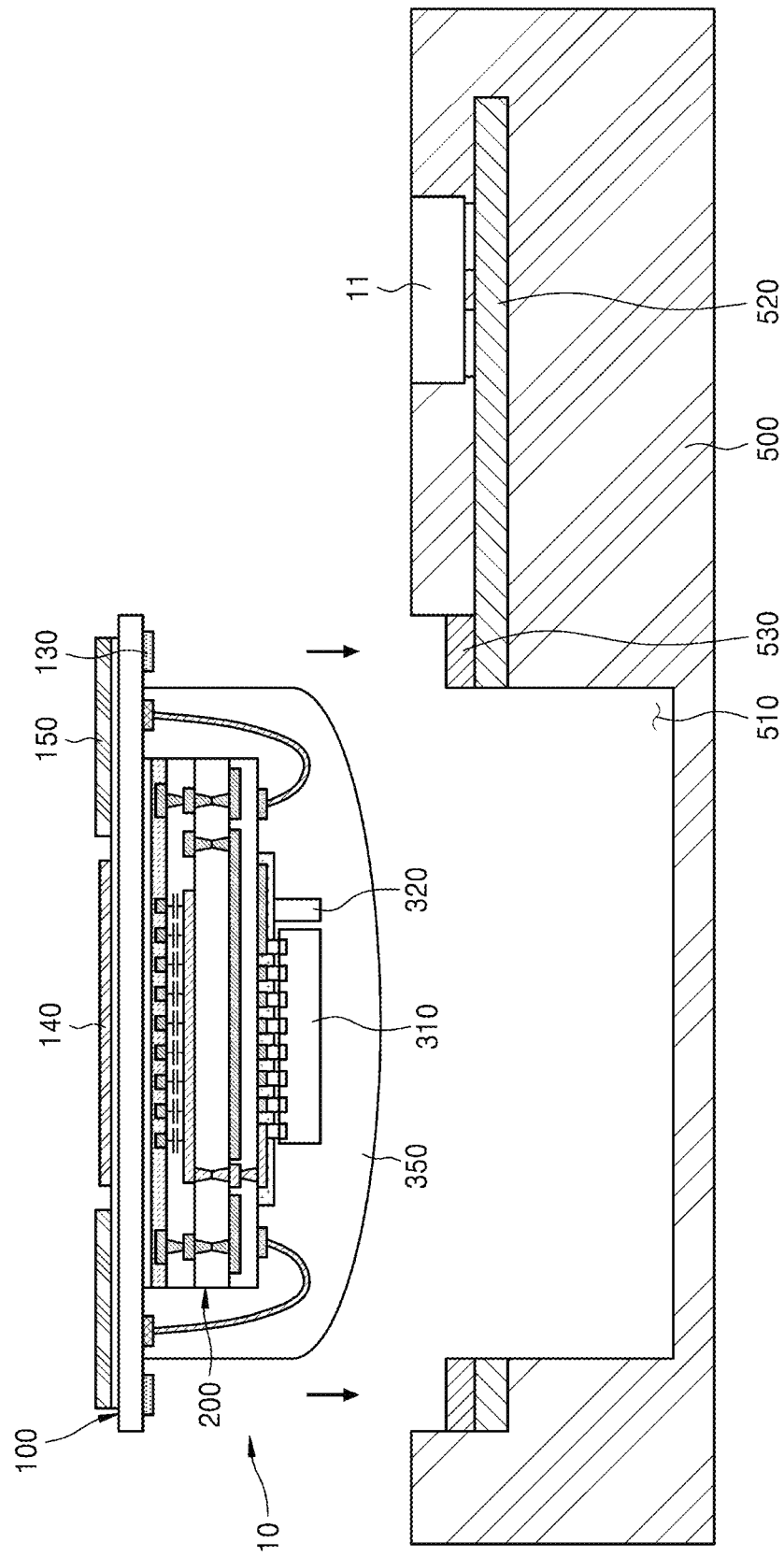

Referring to FIG. 10E, a card main body 500 including a card board 520, a connection pad 530, and a security chip 11 is prepared.

The card main body 500 may include a groove region 510 for mounting the fingerprint sensor package 10. A card board 520 and a security chip 11 for storing financial information may be disposed on the card main body 500. For example, the card board 520 may be an FPCB. The security chip 11 may be mounted on the card board 520. The security chip 11 may be disposed in the card main body 500 such that one surface of the security chip 11 is exposed to the outside. In addition, a connection pad 530 for electrical connection between the fingerprint sensor package 10 and other components in the card main body 500 may be disposed on the card board 520. The connection pad 530 may include a conductive material. The card main body 500 may include a groove region 510 for mounting the fingerprint sensor package 10.

Figure 10F:
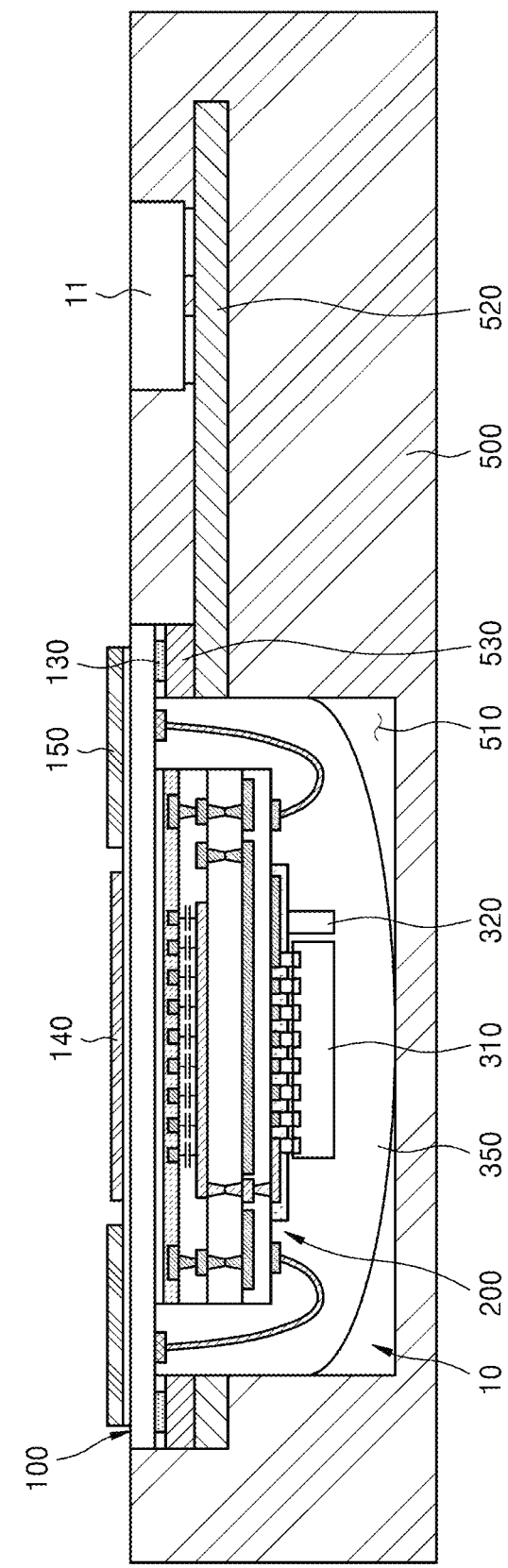

Referring to FIG. 10F, the fingerprint sensor package 10 is mounted on the card main body 500.

A part of the fingerprint sensor package 10 may be accommodated in the groove region 510 of the card main body 500. The molding layer 350 of the fingerprint sensor package 10 may be accommodated in the groove region 510, and the external connection pad 130 of the first substrate 100 may be bonded to the connection pad 530 of the card board 520. The external connection pad 130 of the first substrate 100 may be physically and electrically connected to the connection pad 530 of the card board 520. In some example embodiments, the groove region 510 is not completely filled by the molding layer 350 of the fingerprint sensor package 10, and a flow space may be formed between the molding layer 350 of the fingerprint sensor package 10 and the card main body 500. The flow space provides a space in which the fingerprint sensor package 10 may flexibly respond according to the degree of bending of the smart card 1. In other embodiments, the flow space may be filled by applying an adhesive. As shown in FIG. 10E, the fingerprint sensor package 10 may be mounted on the card main body 500 such that the coating layer 140 and the ground bezel 150 are exposed to an exterior of the smart card 1.

Referring again to FIG. 1, the smart card 1 may include a fingerprint sensor package 10, a security chip 11, a display unit 12, and a power button 13. When a user brings a fingerprint into contact with the fingerprint sensor package 10 of the smart card 1, the touched fingerprint may be recognized. When the recognized fingerprint matches the registered fingerprint, the security chip 11 may grant payment authorization to the user of the smart card 1.

Figure 11:
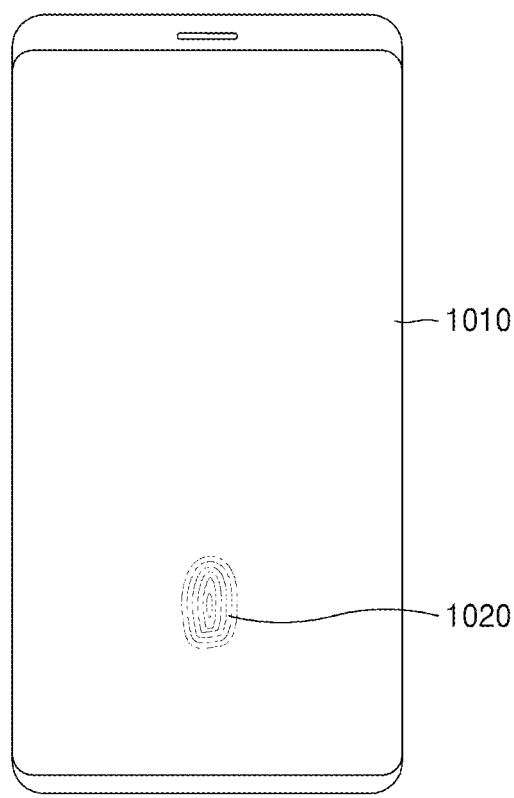
FIG. 11 is a plan view illustrating a mobile device including a fingerprint sensor package according to some example embodiments of the present inventive concepts.

FIG. 11 is a plan view illustrating a mobile device 1000 including a fingerprint sensor package according to some example embodiments of the present inventive concepts.

Referring to FIG. 11, the mobile device 1000 may include a touch screen type display 1010 and a fingerprint sensor package 1020.

The mobile device 1000 may further include a camera, a speaker, a temperature sensor, a motion sensor, and the like. Although a smart phone is exemplified as the mobile device 1000, the present inventive concepts are not limited thereto. For example, the mobile device 1000 may be a wearable device such as a notebook computer, a tablet computer, or a smart watch, on which the fingerprint sensor package 1020 may be mounted. In the mobile device 1000, the fingerprint sensor package 1020 may be disposed on the display 1010. The fingerprint sensor package 1020 may correspond to any one selected from the fingerprint sensor packages 10, 20, 30, and 40 described above with reference to FIGS. 2A to 9.

While the inventive concepts have been particularly shown and described with reference to some example embodiments thereof, it will be understood that various changes in form and details may be made therein without departing from the spirit and scope of the following claims.

What is claimed is:

1. A fingerprint sensor package, comprising:
   a first substrate including
      a core insulating layer including a first surface and a second surface opposite to each other,
      a first bonding pad on the second surface of the core insulating layer, and
      an external connection pad between an edge of the second surface of the core insulating layer and the first bonding pad;
   a second substrate on the second surface of the core insulating layer, the second substrate including
      a plurality of first sensing patterns isolated from direct contact with each other in a first direction and extending in a second direction intersecting with the first direction,
      a plurality of second sensing patterns isolated from direct contact with each other in the second direction and extending in the first direction, and
      a second bonding pad;
   a conductive wire electrically connecting the first bonding pad to the second bonding pad;
   a controller chip on the second substrate; and
   a molding layer on the second surface of the core insulating layer and the second substrate, the molding layer covering the second substrate and the first bonding pad, the molding layer isolated from direct contact with the external connection pad.

2. The fingerprint sensor package of claim 1, wherein the second substrate comprises
   a sensing region that includes the plurality of first sensing patterns and the plurality of second sensing patterns, and
   a peripheral region surrounding the sensing region in the first direction and the second direction; and
   the first substrate further comprises a coating layer on the first surface of the core insulating layer and overlapping the sensing region of the second substrate in a third direction perpendicular to the first direction and the second direction.

3. The fingerprint sensor package of claim 2, wherein a thickness of the coating layer is between about 5 μm and about 100 μm.

4. The fingerprint sensor package of claim 2, further comprising:
   a ground bezel on the first surface of the core insulating layer, the ground bezel surrounding the coating layer in the first direction and the second direction.

5. The fingerprint sensor package of claim 4, wherein the first substrate further comprises an adhesive layer between the ground bezel and the core insulating layer, the adhesive layer further being between the coating layer and the core insulating layer.

6. The fingerprint sensor package of claim 4, wherein a distance between the ground bezel and the coating layer is between about 50 μm and about 5 mm.

7. The fingerprint sensor package of claim 4, wherein the ground bezel comprises
    a plurality of line patterns extending in a periphery of the coating layer, or
    a plurality of sub-patterns collectively extending along a side surface of the coating layer.
8. The fingerprint sensor package of claim 1, further comprising:
    a substrate adhesive layer between an upper surface of the second substrate and the first substrate,
    wherein the controller chip is on a lower surface of the second substrate.
9. The fingerprint sensor package of claim 8, further comprising:
    an inner molding layer on the lower surface of the second substrate, the inner molding layer configured to cover the controller chip,
    wherein the molding layer covers the inner molding layer.
10. A fingerprint sensor package, comprising:
    a first substrate including
        a core insulating layer including a first surface and a second surface opposite to each other,
        a coating layer on the first surface of the core insulating layer,
        a ground bezel on the first surface of the core insulating layer, the ground bezel surrounding the coating layer in a first direction and a second direction intersecting with the first direction,
        an adhesive layer between the coating layer and the core insulating layer, the adhesive layer further between the core insulating layer and the ground bezel,
        a first bonding pad on the second surface of the core insulating layer, and
        an external connection pad between an edge of the second surface of the core insulating layer and the first bonding pad;
    a second substrate on the second surface of the core insulating layer, the second substrate including
        a plurality of first sensing patterns isolated from direct contact with each other in the first direction and extending in the second direction,
        a plurality of second sensing patterns isolated from direct contact with each other in the second direction and extending in the first direction, and
        a second bonding pad;
    a conductive wire electrically connecting the first bonding pad to the second bonding pad;
    a controller chip on the second substrate;
    connection bumps between the second substrate and the controller chip and electrically connecting the second substrate to the controller chip; and
    a molding layer covering the second substrate and the controller chip, the molding layer extending from a side surface of the second substrate to a boundary between the first bonding pad and the external connection pad,
    wherein the plurality of first sensing patterns and the plurality of second sensing patterns are isolated from direct contact with each other in a third direction perpendicular to the first and second directions,
    wherein the plurality of first sensing patterns and the plurality of second sensing patterns collectively comprise a plurality of capacitors.
11. The fingerprint sensor package of claim 10, wherein the second substrate further comprises:
    a base layer;
    a lower insulating layer on a lower surface of the base layer; and
    an upper insulating layer on an upper surface of the base layer,
    wherein the plurality of first sensing patterns are on the upper surface of the base layer,
    wherein the plurality of second sensing patterns are on an upper surface of the upper insulating layer,
    wherein the second bonding pad and the controller chip are on a lower surface of the lower insulating layer.
12. The fingerprint sensor package of claim 11, wherein the second substrate further comprises:
    a first ground pattern on the lower surface of the lower insulating layer;
    a second ground pattern on the lower surface of the base layer and electrically connected to the first ground pattern;
    a third ground pattern on the upper surface of the base layer and electrically connected to the second ground pattern; and
    a fourth ground pattern on the upper surface of the upper insulating layer and electrically connected to the third ground pattern,
    wherein the fourth ground pattern surrounds the plurality of second sensing patterns in a plan view.
13. The fingerprint sensor package of claim 12, wherein the second substrate further comprises:
    a first conductive via extending in the third direction in the lower insulating layer;
    a second conductive via extending in the third direction in the base layer and coupled to the first conductive via;
    a third conductive via extending in the third direction in the base layer and coupled to the second conductive via; and
    a fourth conductive via extending in the third direction in the upper insulating layer and coupled to the third conductive via,
    wherein the first to fourth conductive vias electrically connect the first ground pattern and the fourth ground pattern,
    wherein the first to fourth conductive vias are tapered toward a center in a thickness direction of the base layer.
14. The fingerprint sensor package of claim 10, further comprising:
    an inner molding layer covering the controller chip,
    wherein the second bonding pad is in an opening of the inner molding layer.
15. The fingerprint sensor package of claim 10, wherein
    a thickness of the coating layer is between about 5 μm to about 50 μm, and
    a distance between the coating layer and the ground bezel is between about 50 μm and about 5 mm.
16. A smart card, comprising:
    a card main body including a groove region and a connection pad;
    a security chip in the card main body; and
    a fingerprint sensor package configured to sense a user's fingerprint and transmitting a signal for a sensing result to the security chip,
    wherein the fingerprint sensor package includes
        a first substrate including
            a core insulating layer including a first surface and a second surface opposite to each other,
            a first bonding pad on the second surface of the core insulating layer, and an external connection pad between an edge of the second surface of the core insulating layer and the first bonding pad,
a second substrate on the second surface of the core insulating layer, the second substrate including
a plurality of first sensing patterns isolated from direct contact with each other in a first direction and extending in a second direction intersecting with the first direction,
a plurality of second sensing patterns isolated from direct contact with each other in the second direction and extending in the first direction, and
a second bonding pad,
a conductive wire extending between the first bonding pad and the second bonding pad and electrically connecting the first bonding pad to the second bonding pad,
a controller chip on the second substrate, and
a molding layer on the second surface of the core insulating layer and on the second substrate, the molding layer covering the second substrate and the first bonding pad, the molding layer not covering the external connection pad,
wherein the external connection pad of the first substrate is bonded to the connection pad of the card main body.

17. The smart card of claim 16, wherein the first substrate further comprises:
a coating layer on the first surface of the core insulating layer;
a ground bezel extending along a circumference of the coating layer on the first surface of the core insulating layer; and
an adhesive layer between the coating layer and the core insulating layer, the adhesive layer further being between the ground bezel and the core insulating layer,
wherein the fingerprint sensor package is mounted on the card main body such that the coating layer and the ground bezel are exposed to an exterior of the smart card.

18. The smart card of claim 16, wherein the fingerprint sensor package further comprises an inner molding layer that covers a portion of a lower surface of the second substrate and the controller chip, and is between the controller chip and the molding layer.

19. The smart card of claim 16, wherein the molding layer extends laterally from a side surface of the second substrate to a boundary between the first bonding pad and the external connection pad.

20. The smart card of claim 16, wherein the first substrate has a rectangular planar shape with round corners.

* * * * *